(12) United States Patent
Christmann

(10) Patent No.: US 8,766,576 B2
(45) Date of Patent: Jul. 1, 2014

(54) FAULT DETECTION METHOD FOR ELECTRIC MOTORS WITH ONE OR SEVERAL STAR POINTS

(75) Inventor: Markus Christmann, München (DE)

(73) Assignee: EADS Deutschland GmbH, Ottobrunn (DE)

( * ) Notice: Subject to any disclaimer, the term of this patent is extended or adjusted under 35 U.S.C. 154(b) by 360 days.

(21) Appl. No.: 13/183,152

(22) Filed: Jul. 14, 2011

(65) Prior Publication Data

US 2011/0266986 A1 Nov. 3, 2011

Related U.S. Application Data

(63) Continuation of application No. PCT/EP2010/050346, filed on Jan. 13, 2010.

(30) Foreign Application Priority Data

Jan. 14, 2009 (DE) .......................... 10 2009 004 556

(51) Int. Cl.
*H02H 7/08* (2006.01)
(52) U.S. Cl.
USPC ............. 318/400.21; 318/400.27; 318/400.34
(58) Field of Classification Search
USPC .............. 318/400.21, 400.27, 400.34, 400.14
See application file for complete search history.

(56) References Cited

U.S. PATENT DOCUMENTS

| 7,483,796 B2 | 1/2009 | McLaughlin et al. |
| 7,511,439 B2 | 3/2009 | Bosch et al. |
| 2006/0122796 A1 | 6/2006 | McLaughlin et al. |
| 2007/0210732 A1 | 9/2007 | Bosch et al. |
| 2010/0169260 A1* | 7/2010 | Hyde et al. ...................... 706/46 |

FOREIGN PATENT DOCUMENTS

| DE | 10327142 A1 | 1/2005 |
| DE | 102004013241 A1 | 10/2005 |
| DE | 102007027481 A1 | 12/2008 |

OTHER PUBLICATIONS

International Searching Authority, International Search Report for Application No. PCT/EP2010/050346 dated Jan. 31, 2011.
German Office Action for German Patent Application 10 2009 004 556.2 mailed on Dec. 23, 2009.
International Preliminary Report on Patentability dated Jul. 28, 2011 for Application No. PCT/EP2010/050346.

* cited by examiner

*Primary Examiner* — Karen Masih
(74) *Attorney, Agent, or Firm* — Ingrassia Fisher & Lorenz P.C.

(57) ABSTRACT

A detection and control device is provided for detecting a motor fault of an electric motor with star point topology, with an evaluation unit, a control unit, and a return unit. The return unit is configured for returning a star point potential of the electric motor to the evaluation unit, the evaluation unit is configured for evaluating the star point potential and the control unit is designed for passivating a motor fault on the basis of the evaluation. The function of the return unit and of the evaluation unit may also be assumed by control lines and by the control unit.

10 Claims, 20 Drawing Sheets

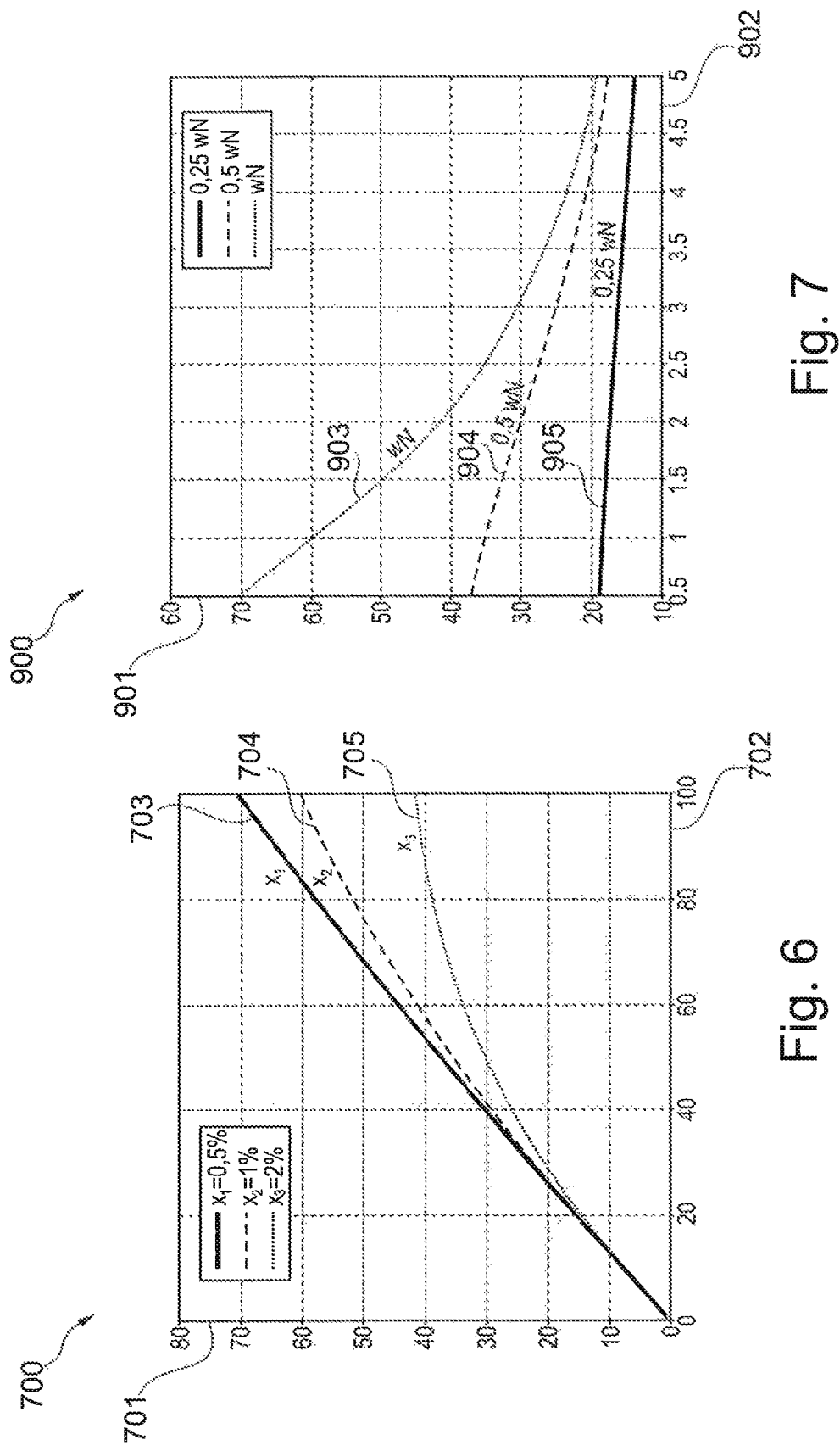

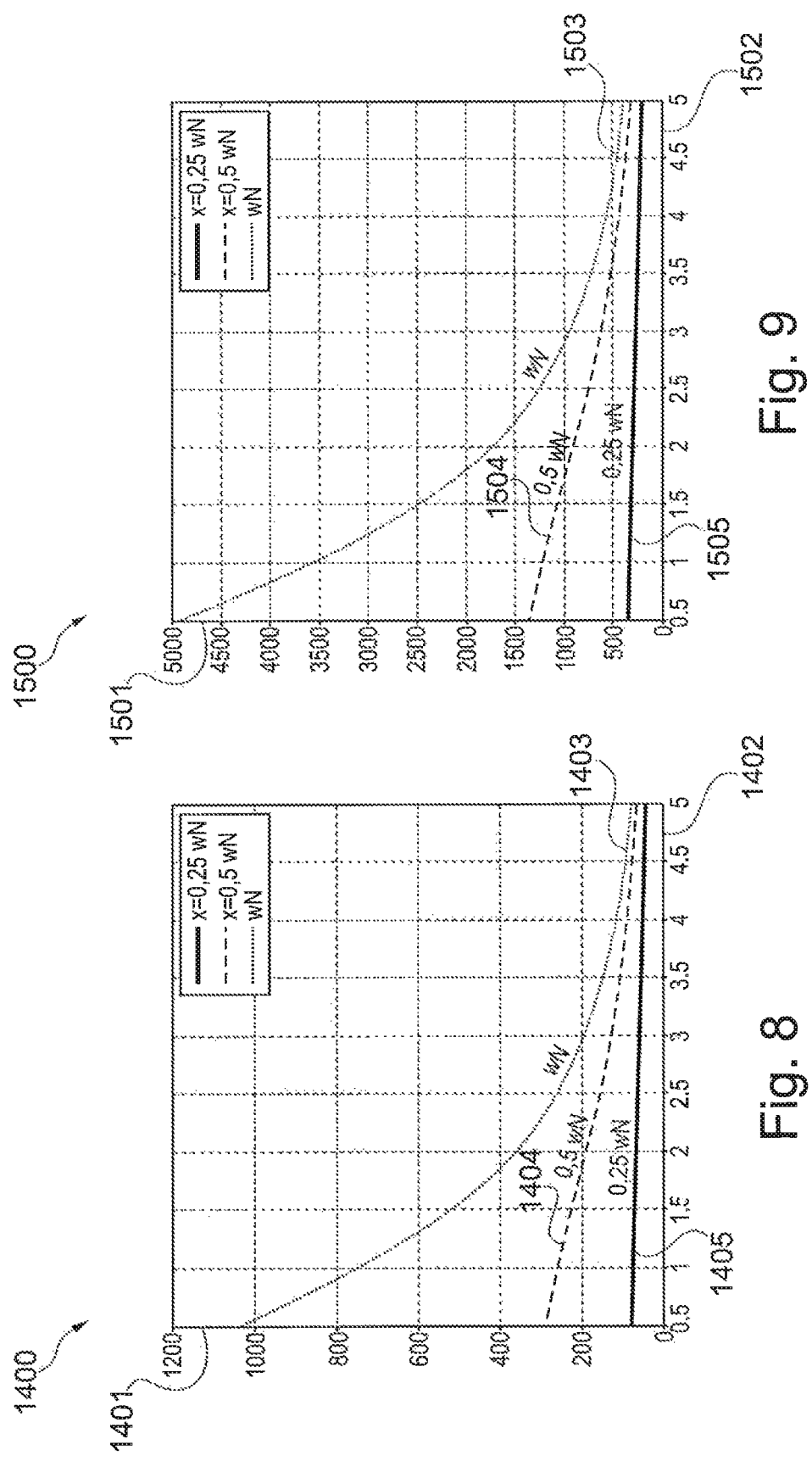

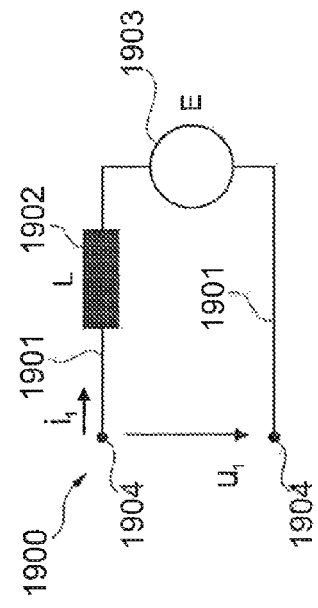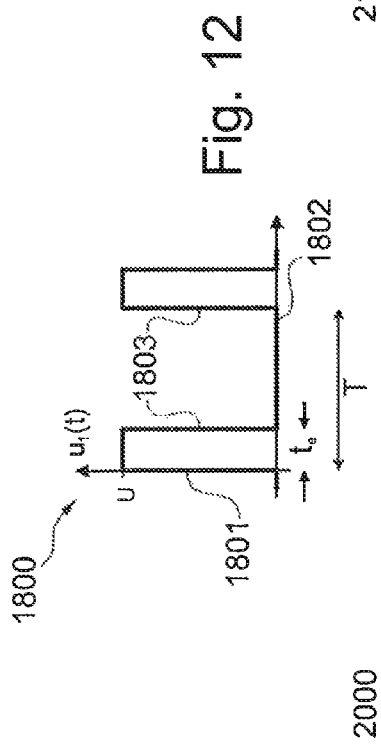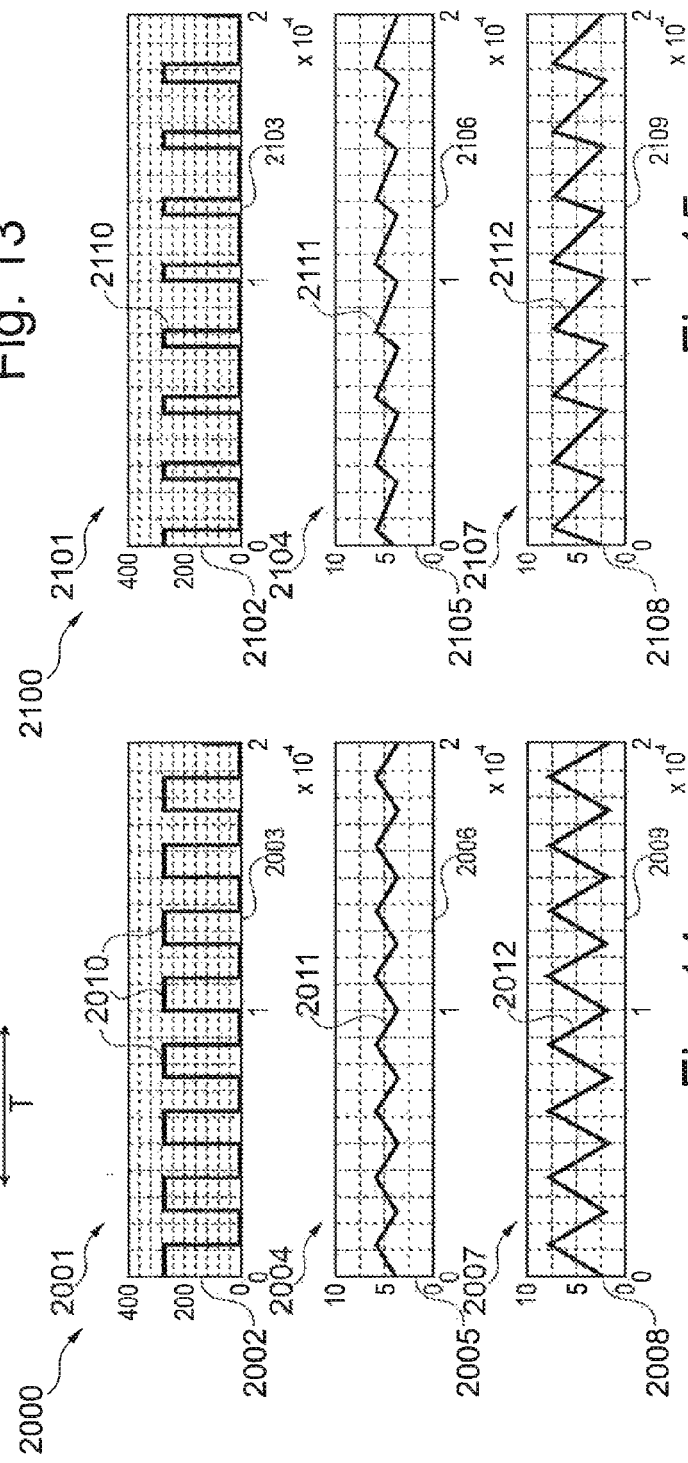

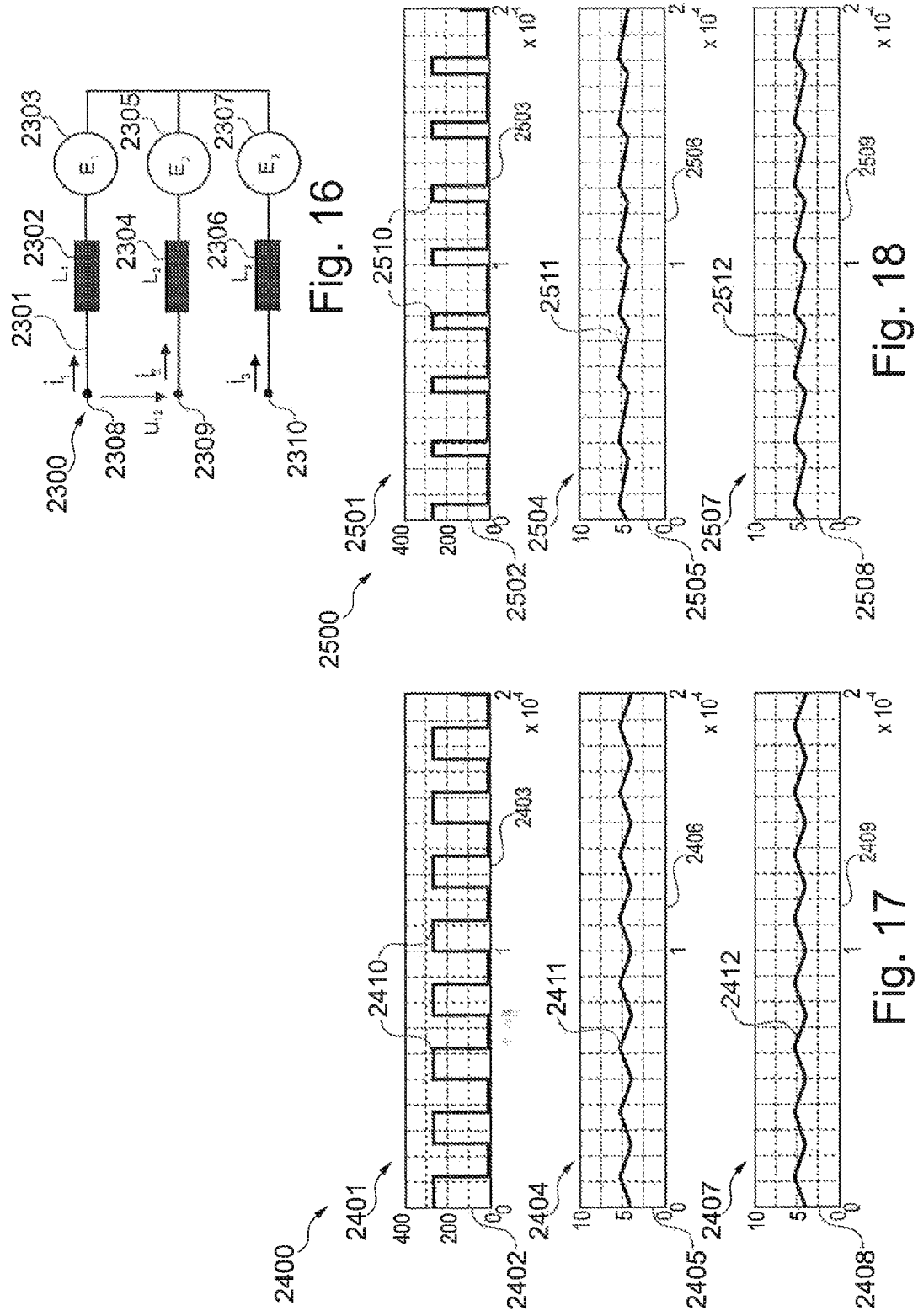

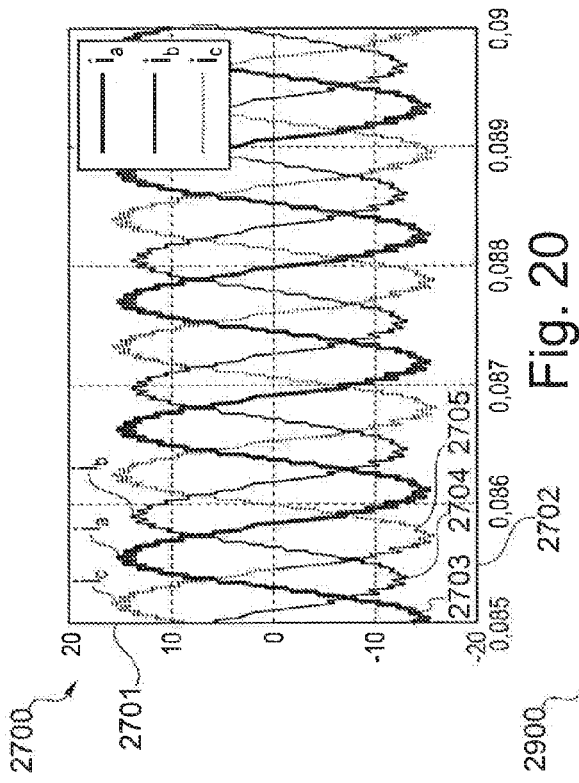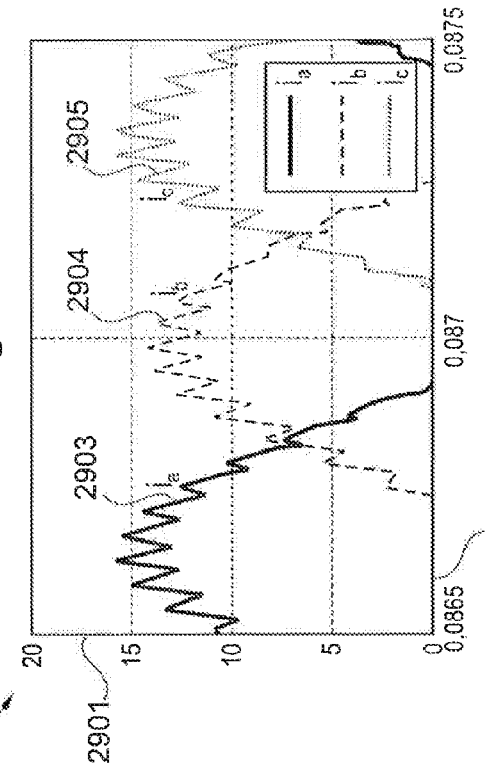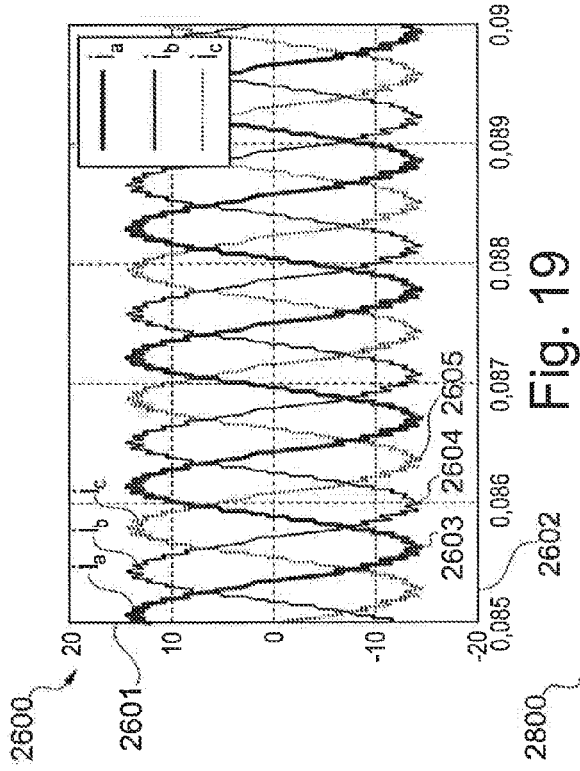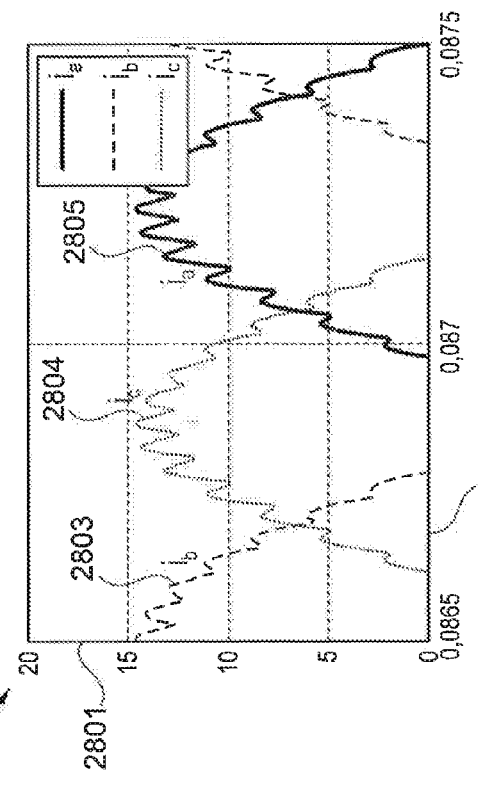
Fig. 19
Fig. 20
Fig. 21
Fig. 22

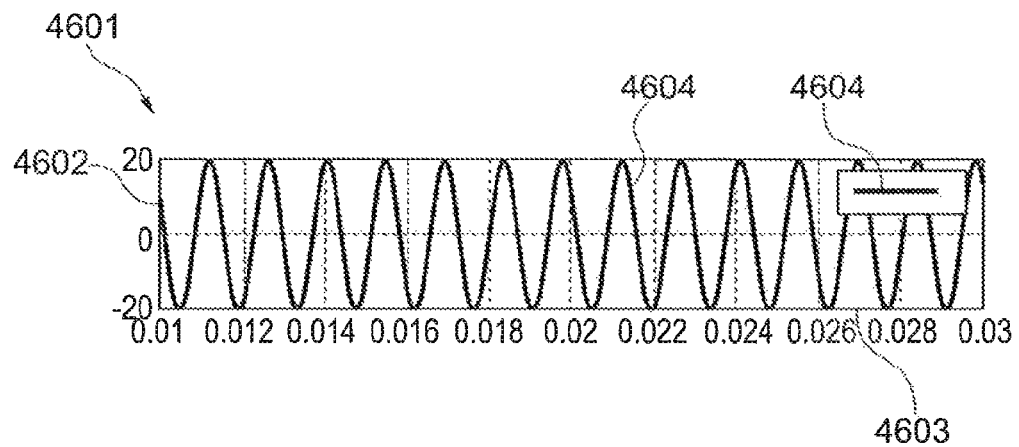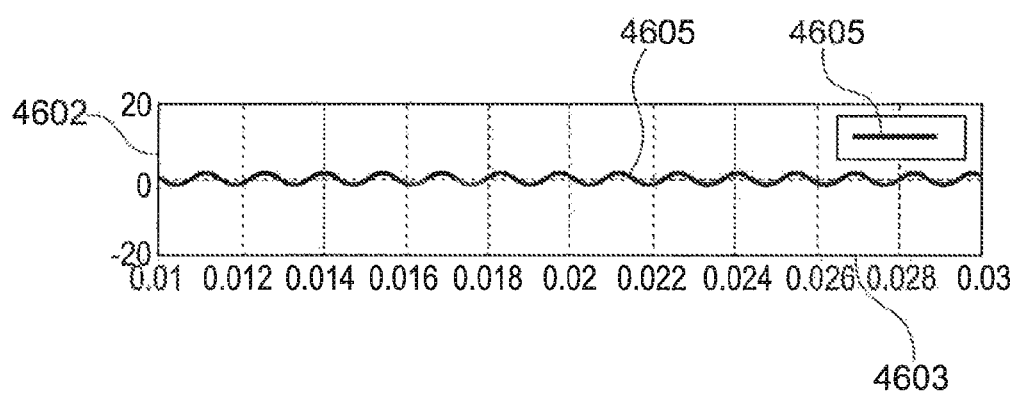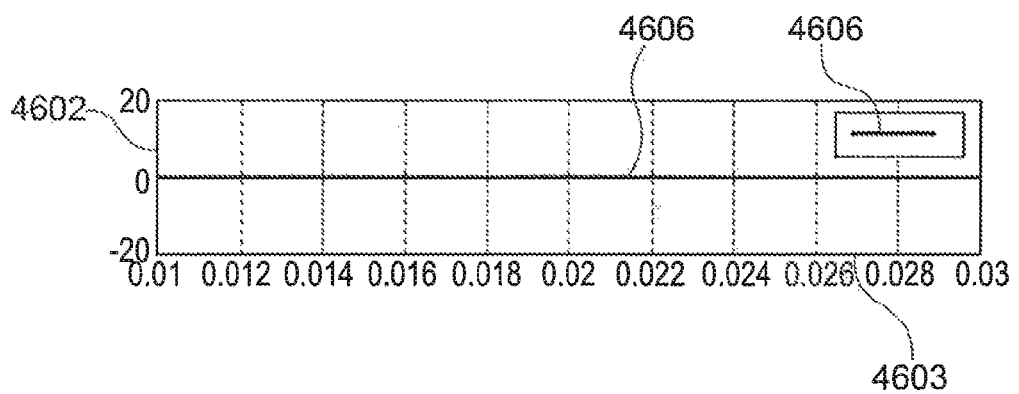
Fig. 26

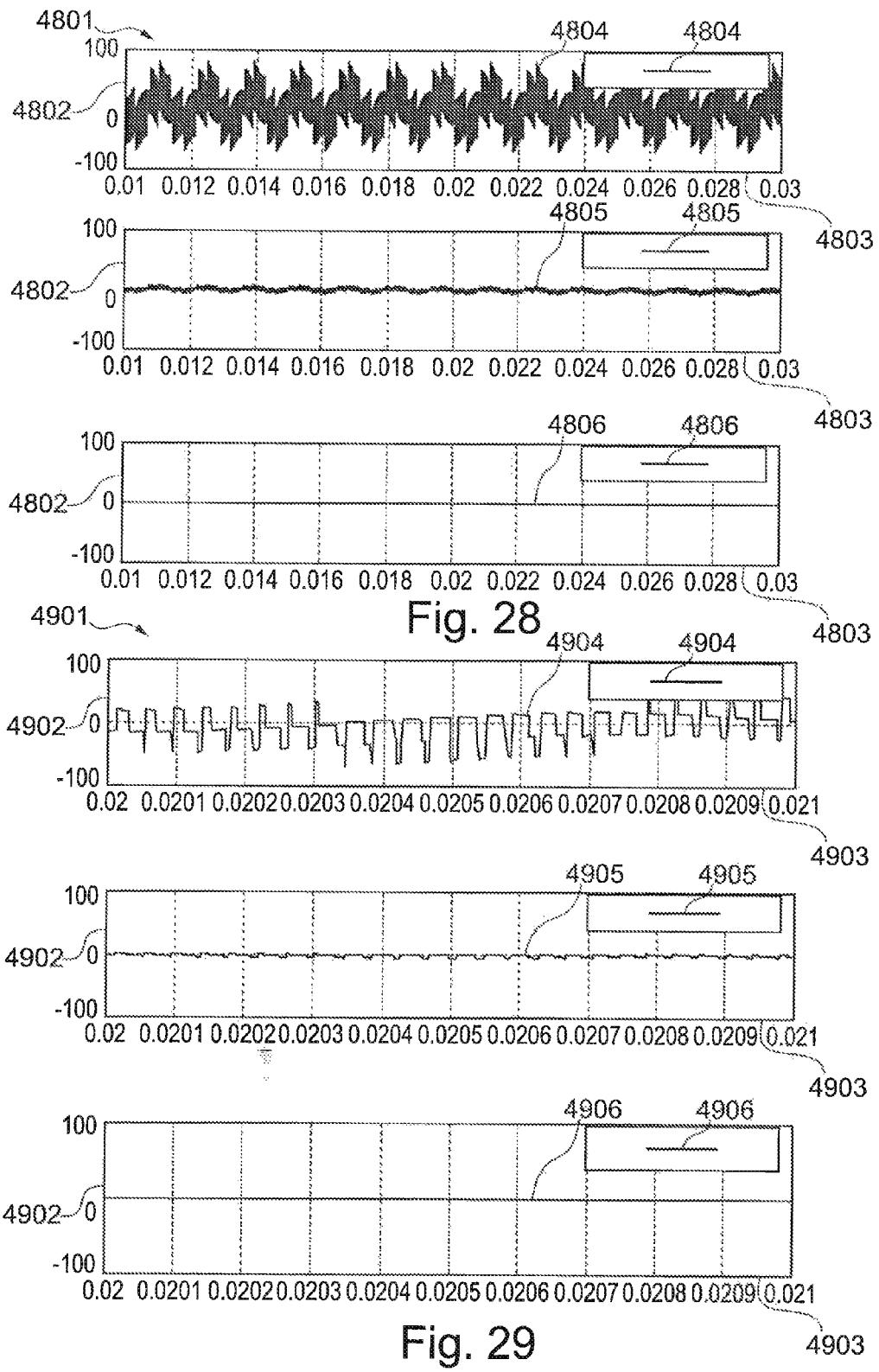

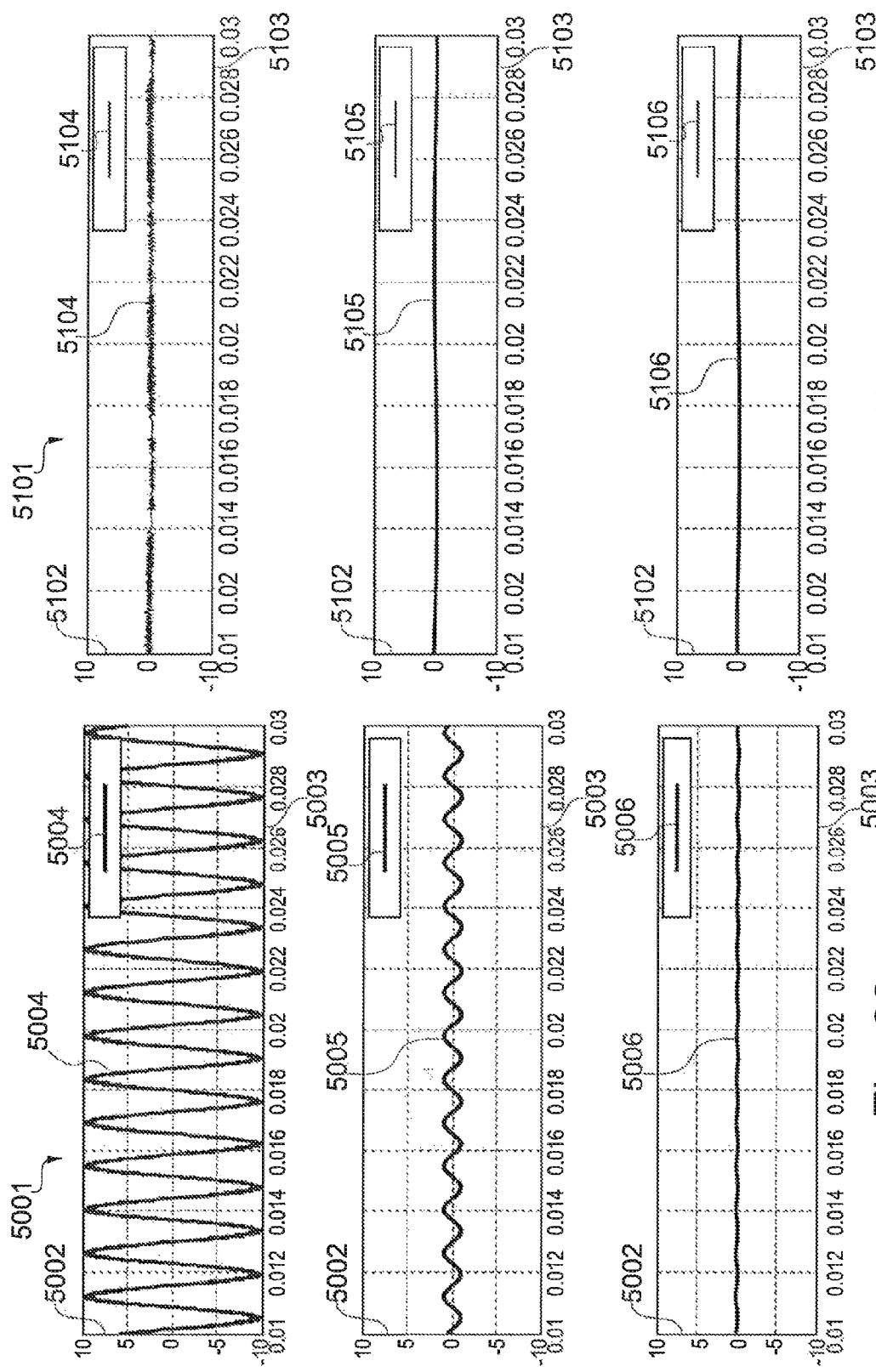

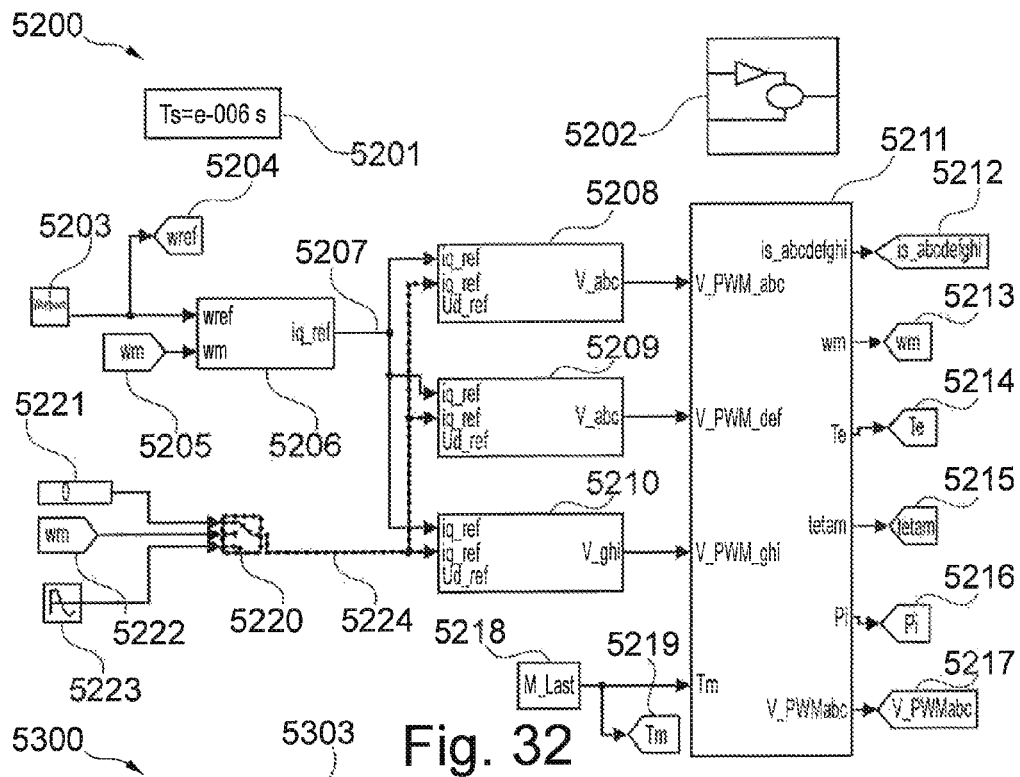
Fig. 32
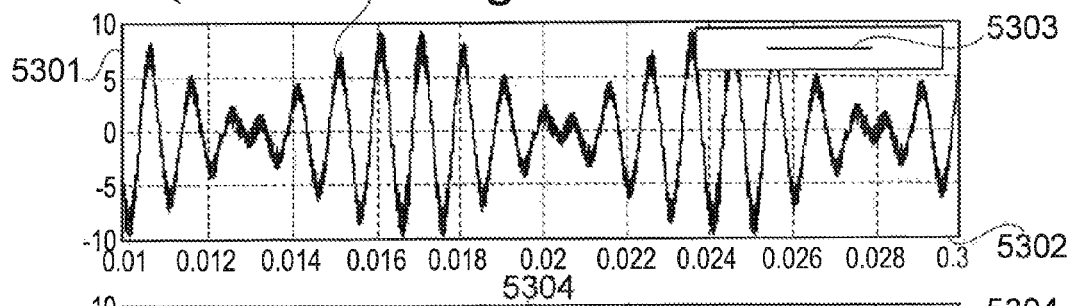
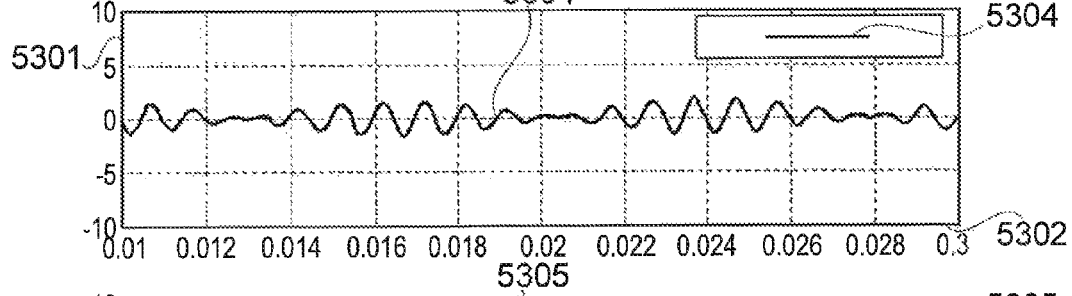
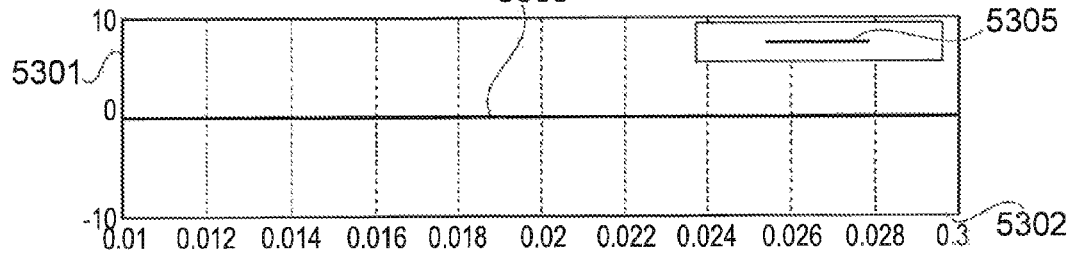
Fig. 33

FAULT DETECTION METHOD FOR ELECTRIC MOTORS WITH ONE OR SEVERAL STAR POINTS

CROSS-REFERENCE TO RELATED APPLICATIONS

This is a continuation of International Application No. PCT/EP2010/050346, filed Jan. 13, 2010, which application claims priority to German Patent Application No. 10 2009 004 556.2 filed Jan. 14, 2009, which is hereby incorporated in their entirety by reference.

TECHNICAL FIELD

The technical field relates to the fault detection and control of electric motors with star point topology. In particular, the technical field relates to a detection and control device with an evaluation unit, a control unit and a return unit. Furthermore, the technical field relates to an electric motor, to an aircraft and to a landing flap drive system, as well as to a method of detecting a motor fault of an electric motor.

BACKGROUND

Partial short circuits in permanently excited electric motors (PMSM) are difficult to detect, and by way of the back induction voltage they may result in very high short-circuit currents and very high heating rates in the region of 1,000 K/s, unless the entire associated winding phase is short-circuited. This problem is relevant in all redundant designed PMSM drives, in which the rotor of a defective motor is to continue rotating. The above are, in particular, internally redundant motors and torque-adding motors on one shaft or on several coupled shafts. Partial short circuits in motors with star point circuitries of the windings are particularly difficult to detect.

Partial short circuits in motors may only inadequately be detected and evaluated by an evaluation of the current measured at the motor terminals of an electric motor, in particular in motors with a star point circuitry of the windings.

In view of the foregoing, it is at least one object to provide for a device and a method for improved determination of motor faults in permanently excited electric motors with a star point topology. In addition, other objects, desirable features, and characteristics will become apparent from the subsequent summary and detailed description and the appended claims, taken in conjunction with the accompanying drawings and this background.

SUMMARY

The at least one object, other objects, desirable features, and characteristics of the invention may be met by a detection and control device for detecting a motor fault of an electric motor with star point topology. The device includes, but is not limited to an evaluation unit, a control unit, a return unit and several control lines. The return unit is adapted for returning a star point potential of the electric motor to the evaluation unit which is adapted to evaluate the star point potential. The control unit is adapted for passivating a motor fault on the basis of the evaluation.

According to an exemplary embodiment, a detection and control device for detecting a motor fault of an electric motor with star point topology is provided, wherein the detection and control device comprises an evaluation unit, a control unit, a return unit and several control lines. The return unit is designed for returning one or several star point potentials of the electric motor to the evaluation unit, the evaluation unit is designed for evaluating the star point potential/s, and the control unit is designed for passivating a motor fault on the basis of the evaluation.

Such a detection and control device enables to detect and passivate a motor fault by a complete short-circuit of the associated star point system. In this manner, and in conjunction with a suitable magnetic-circuit design of the motor, limitation of the short-circuit current and of the resulting disturbance torque to non-critical values is possible. In case of a redundant motor design, the drive may continue to be operated. Fault propagation and subsequent faults may be avoided. In this arrangement the star point potential is returned and evaluated.

According to an exemplary embodiment, the evaluation takes place on the basis of a comparison of the star point potential with a reference potential, wherein the reference potential is calculated. According to a further embodiment, the evaluation takes place on the basis of a comparison of the star point potential with a reference potential, wherein the reference potential is generated in an analogue manner. According to a further embodiment, the evaluation takes place on the basis of a comparison of the star point potential with a reference potential, wherein a fault voltage between star point potential and reference potential, which fault voltage may be evaluated, is generated by the control unit by directed impression of a reactive current component, via the control lines into the stator winding of the motor.

According to a further embodiment, passivation takes place by short-circuiting a star point system in which a motor fault has been detected. According to a further exemplary embodiment, passivation makes it possible to limit a short-circuit current and a resulting disturbance torque or a resulting thermal overload of an electric motor. According to a further exemplary embodiment, the return unit is designed as a connecting line between a star point of the electric motor and the evaluation unit.

It should be pointed out that "comprising" does not exclude other elements or steps, and "a" or "an" does not exclude a plurality.

According to a further exemplary embodiment, returning the star point potential of the electric motor to the control unit takes place via the control lines such that the control lines also assume the function of the return unit, and the control unit also assumes the function of the evaluation unit. This means that the return unit at least in part comprises the control lines, in other words that the control lines form part of the return unit.

According to a further exemplary embodiment, the existing control lines between the amplifier and the terminals of one or several star point systems of the electric motor in conjunction with devices for voltage measuring are used as a return unit, wherein these control lines, whose actual purpose is to carry the motor currents, are switched to be current-free at suitable points in time, and are used to measure the star point potential.

According to a further exemplary embodiment, current-free switching and voltage measuring take place at each one of the above-described connecting lines at the point in time of the zero crossing of the motor back induction voltage in the part of the motor winding, which part is arranged between the star point and the respective motor terminal.

According to a further exemplary embodiment, the evaluation of voltage measuring takes place at one or at each of the above-described connecting lines, taking into account the back induction voltage of the electric motor. According to a further exemplary embodiment, the evaluation unit and the control unit are designed to be integrated with each other.

According to a further embodiment, an electric motor is provided with a detection and control device. According to a further exemplary embodiment, an aircraft is provided with a detection and control device. According to a further embodiment, an actuator is provided with a detection and control device. According to a further embodiment, a landing flap drive system is provided with a detection and control device.

According to a further embodiment of the invention, a compressor motor, for example for a turbine or a cabin air conditioning system, is provided with a detection and control device. According to a further embodiment, a pump motor, for example for fuel, coolant, hydraulics, is provided with a detection and control device. According to a further embodiment, an electric generator is provided with a detection and control device. According to a further embodiment, a fan drive or propeller drive is provided with a detection and control device. According to a further exemplary embodiment, the use of a detection and control device is provided in an aircraft.

According to a further embodiment, a method is provided for detecting a motor fault of an electric motor with star point topology is stated, wherein the method comprises the following steps: providing an evaluation unit, a control unit, a return unit and several control lines; returning a star point potential of the electric motor via the return unit to the evaluation unit, or via the control lines to the control unit; evaluating the star point potential by the evaluation unit or the control unit, and passivating the motor fault by the control unit on the basis of the evaluation.

According to a further exemplary embodiment, a method is provided, wherein evaluating the star point potential takes place by a comparison of the star point potential with a reference point, and wherein passivating the motor fault takes place by short-circuiting a star point system in which a motor fault has been detected.

The individual features of the various exemplary embodiments may, of course, also be combined with each other, as a result of which, in part, advantageous effects may arise which exceed the sum of the individual effects, even if these are not explicitly described. These and other aspects of the invention will become apparent from and elucidated with reference to the exemplary embodiments described hereinafter.

BRIEF DESCRIPTION OF THE DRAWINGS

Exemplary embodiments will be described in the following with reference to the following drawings:

FIG. 6 shows a graphic illustration of the relative partial short-circuit-/interturn short-circuit current as a function of the motor speed of a PMSM;
FIG. 7 shows a graphic illustration of the relative interturn short-circuit current as a function of the percentage of the short-circuited turns relative to the total number of turns in a winding phase of a PMSM;
FIG. 8 shows a graphic illustration of an initial heating rate of the short-circuited turns in an interturn short-circuit of a PMSM;
FIG. 9 shows a graphic illustration of a relative heating rate of the short-circuited turns in an interturn short-circuit of a PMSM;
FIG. 12 shows a graphic illustration of the voltage curve over time;
FIG. 13 shows a single-phase equivalent circuit diagram of a PMSM;
FIG. 14 in three graphic illustrations shows the curve of the PWM voltage at a pulse width of 50% as well as the curve of the current ripple for a functioning phase and the current ripple in an interturn short-circuit in a phase of the PMSM;
FIG. 15 in three graphic illustrations shows the PWM voltage at a pulse width of 25%, a current ripple in a fault-free phase and a current ripple in an interturn short-circuit in a phase of the PMSM;
FIG. 16 shows a schematic view of the equivalent circuit diagram for an electric motor with three-phase star point topology;
and
FIG. 17 shows a PWM voltage curve at a pulse width of 50% as well as the current ripple for a functioning phase and the current ripple for a phase with an interturn short-circuit of a star point system according to FIG. 16;
FIG. 18 shows a PWM voltage curve at a pulse width of 25% as well as the current ripple for a functioning phase and the current ripple for a phase with an interturn short-circuit of a star point system according to FIG. 16;
FIG. 19 shows a graphic illustration of phase currents in functioning phases in a controlled servo drive for 3×3 phases with star point topology;
FIG. 20 shows a graphic illustration of the phase currents in case of a fault in a phase c in a controlled servo drive for 3×3 phases with star point topology;
FIG. 21 shows an enlarged graphic illustration of the phase currents in functioning phases in a controlled servo drive for 3×3 phases with star point topology;
FIG. 22 shows an enlarged view of the phase currents in case of a fault in phase c in a controlled servo drive for 3×3 phases with star point topology;
FIG. 26 shows graphic illustrations of the fault voltages of the star points (potential difference between star point potential and reference potential) of an exemplary motor with a continuous-time voltage supply according to an exemplary embodiment.

FIG. 28 in three graphic illustrations shows the unfiltered time curve of the fault voltages of the star points in case of a switching PWM voltage supply according to an exemplary embodiment;

FIG. 29 in three graphic illustrations shows the unfiltered time curve of the fault voltages of the star points in case of a switching PWM voltage supply in a zoom view according to an exemplary embodiment;

FIG. 30 in three graphic illustrations shows the filtered curve of the fault voltages of the star points of a PMSM in case of a switching PWM voltage supply according to an exemplary embodiment;

FIG. 31 in three graphic illustrations shows the filtered curve of the fault voltages of the star points of a PMSM in case of low rotation speed according to an exemplary embodiment;

FIG. 32 shows a schematic view of a control method for fault detection in case of low motor rotation speed for a PMSM with star point topology according to an exemplary embodiment;

FIG. 33 in three graphic illustrations shows the filtered curve of the fault voltages of the star points in case of low motor rotation speed and use of the control method of FIG. 32 for fault detection according to an exemplary embodiment;

DETAILED DESCRIPTION

The following detailed description is merely exemplary in nature and is not intended to limit application and uses. Furthermore, there is no intention to be bound by any theory presented in the preceding summary and background or the following detailed description of the invention. The illustrations in the figures are schematic and not to scale. In the following description of the figures the same reference signs are used for identical or similar elements in most cases.

Figure 1:
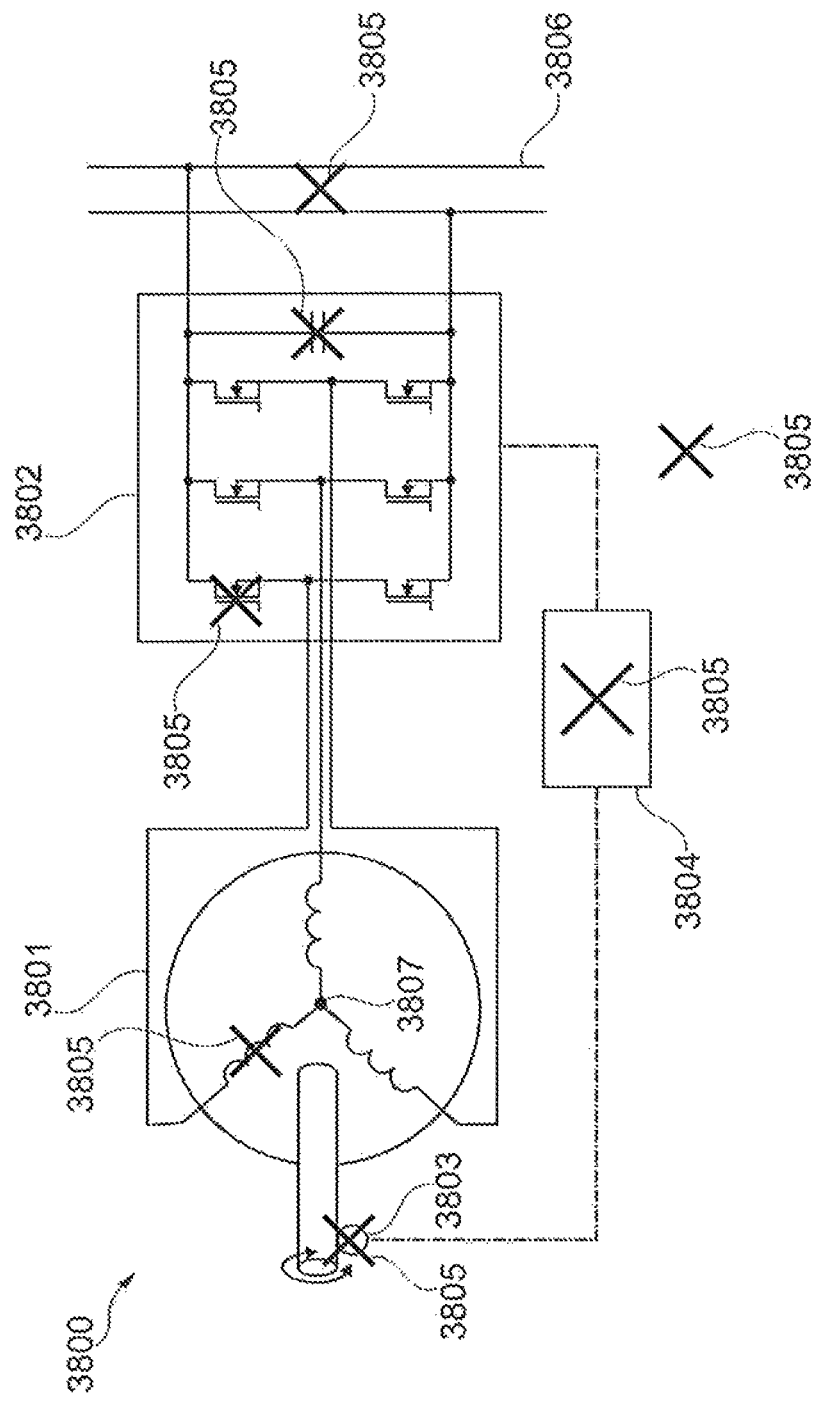
FIG. 1 shows a schematic view of a standard PMSM drive.

FIG. 1 shows a standard PMSM drive 3800 with several fault scenarios 3805 in the stator winding of a motor with star point topology 3801 with a star point 3807, in an angular position sensor 3803 arranged at the drive shaft of the motor 3801, in the intermediate-circuit capacitor as well as in a switch element of an amplifier with a half-bridge 3802, which amplifier is connected to the motor 3801 via several lines at the coils of the motor 3801, in a DC (direct current voltage) bus 3806 and in a control computer 3804, which is connected via lines to the angular position sensor 3803 and to the amplifier with half-bridge 3802. Each fault of an electric component leads to a loss of the drive. The availability of the drive is improved as a result of the implementation of corresponding redundant components.

A suitable drive topology is to ensure that a single (electrical) fault does not result in the failure of the entire drive but instead that the drive may perform its task also in case of a fault (if applicable with reduced performance). In principle many different topologies may be considered for fault-tolerant drives. In each case it is decisive that in case of failure of a subsystem (for example of a phase element) the remaining residual system is able to generate the required torque (at given rotation speed) without thermally overloading the failed subsystem or the remaining residual system. Naturally, this requirement may be more easily achieved with a large number of subsystems. On the other hand the complexity and the error probability increases as the number of subsystems increases if one assumes the same mechanical output in fault-free operation.

Figure 2:
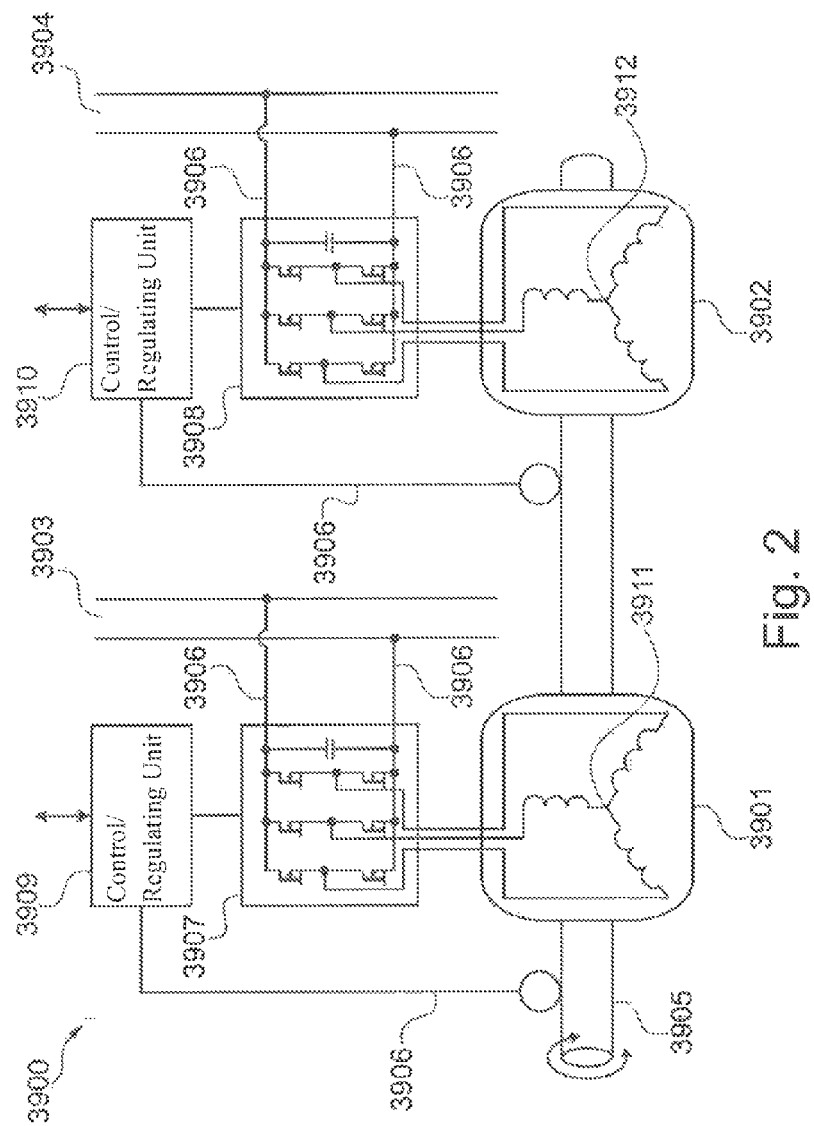
FIG. 2 shows a schematic view of a drive with several torque-adding PMSMs.

FIG. 2 shows a drive with several torque-adding PMSMs 3900, designed for low short-circuit currents and short-circuit torques. A drive shaft 3905 is driven by two PMSMs 3901, 3902 each comprising a star point 3911, 3912. At the shaft 3905 an angular position sensor is arranged next to each of the motors 3901, 3902 for measuring the angle position and the rotational speed of the shaft 3905. Each motor 3901, 3902 is connected via lines to an amplifier with a half-bridge 3907, 3908. The two amplifiers 3907, 3908 provide for the drive of the motor and are each connected via lines 3906 to a DC bus 3903, 3904, as well as to a control/regulating unit (Motor Control Module MCM) 3909, 3910. Each MCM-unit 3909, 3810 (3910) is connected via a line 3906 to an angular position sensor, and monitors and/or controls the state of the corresponding motor 3901, 3902.

Figure 3:
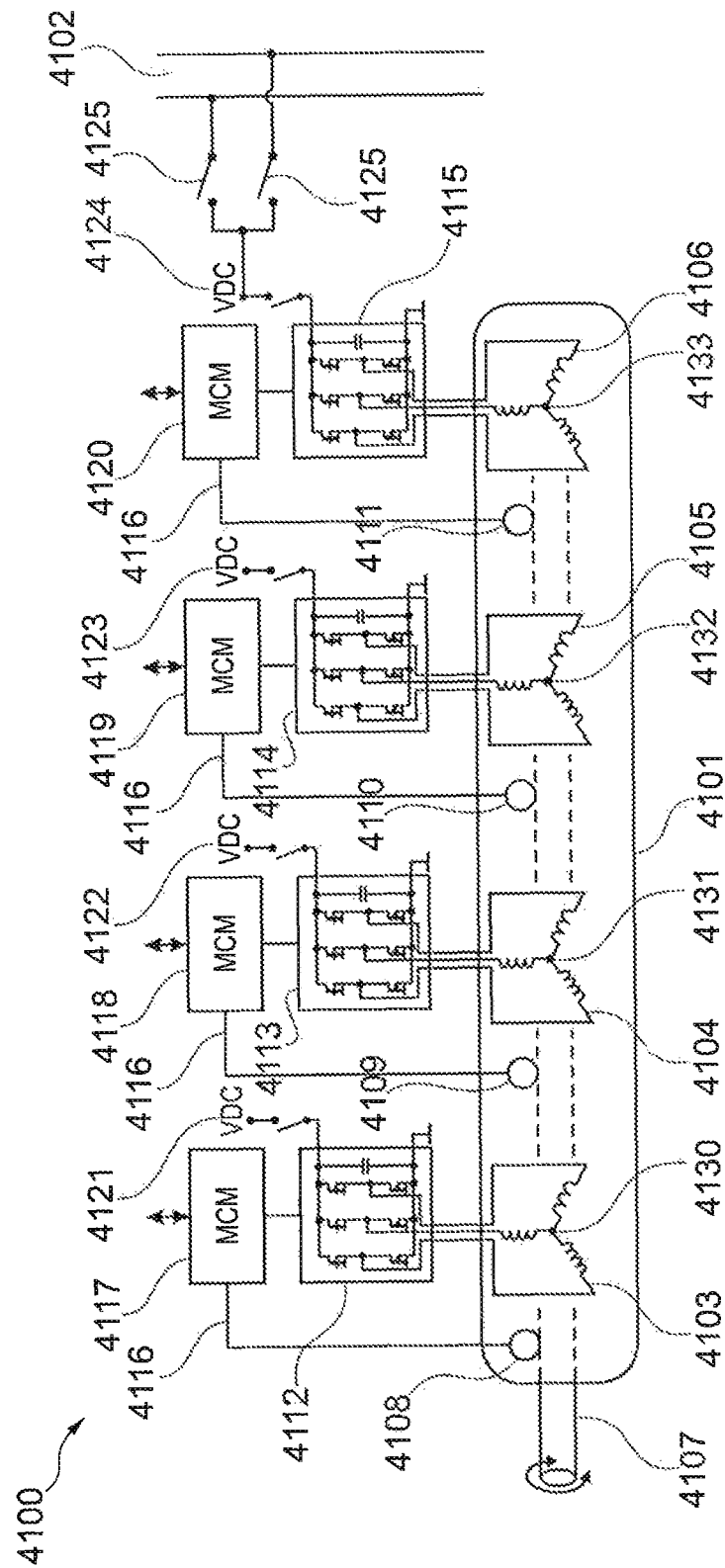
FIG. 3 shows a schematic view of an internally redundant drive with several star point systems.

FIG. 3 shows an internally redundant drive with multi-star point topology 4100 and a physical isolation of the star points. In FIG. 3 a drive shaft 4107 with a drive unit 4101 is shown. The drive unit 4101 is an internally redundant PMSM whose stator windings are interconnected to several (N>1) star point groups 4103, 4104, 4105, 4106, each comprising a star point 4130, 4131, 4132, 4133 with in each case 3 connecting terminals that are connected via lines to an equal number of amplifiers with half-bridges 4112, 4113, 4114, 4115. At the shaft, M>1 (in the present example M=4), redundant angular position sensors 4108, 4109, 4110, 4111 are arranged which measure the angle position and speed of the shaft 4107 and via lines 4116 or an interconnected sensor evaluation unit are suitably connected to L>1 (in the present example L=M=4) MCMs 4117, 4118, 4119, 4120 which are designed to monitor or control the state of part of, or of all, the star point systems 4103, 4104, 4105, 4106 and in each case are connected to the corresponding amplifiers with half-bridges 4112, 4113, 4114, 4115.

Each amplifier with half-bridge 4112, 4113, 4114, 4115 is connected via one or several disconnected switch(es) to one or several direct-current sources VDC 4121, 4122, 4123, 4124, and provides for the supply of current to the coils of the motors 4103, 4104, 4105, 4106. The direct-current sources VDC are connected to DC-networks 4102 via lines and switches 4125. Such a drive with several amplifiers and motors with multi-star point topology enables, that no torque ripple occurs when a motor fault is detected.

Possible approaches to achieving fault-tolerant designs of PMSM drives are a duplication of the drives (FIG. 2) as well as internally redundant motor concepts (e.g., FIG. 3). In case of internally redundant motor concepts the electromagnetic system is disaggregated into largely autonomous subsystems (individual phases or groups comprising several phases). Generally the advantage of providing internal redundancy relates to the saving of weight and installation space.

For internally redundant concepts there exist certain requirements to ensure operation after a fault has occurred. In case of failure of a subsystem (motor or power electronics) the remaining system must be able to generate the required torque without any thermal overload of the failed or of the remaining subsystem. The effect of the fault must remain limited to the affected subsystem. It is mandatory to provide strategies for decoupling both the electromagnetic system and the associated modules of the power electronics. There are cases (in particular at a partial short-circuit or interturn short-circuit of a winding phase), wherein in case of a fault the control device of the motor needs to actively switch off the affected subsystem. In these cases fault detection by the control device is necessary.

Limitation of short-circuit currents occurs by an as high as possible self-inductance of the winding phases. In this way the short-circuit brake torque (torque ripple) may also be reduced to a small value. This "implicit" limitation of the short-circuit current may be achieved by constructive measures in the motor design. For this the leakage inductance must be artificially increased. The leakage inductance may, for example, be set by the width and depth of the groove opening. The disadvantage of a high leakage inductance, however, is an increased voltage demand.

In case of an interturn short-circuit the latter must be detected and the entire phase must be short-circuited in order to limit the occurring maximum short-circuit current. Otherwise, local thermal overload of the winding occurs, which overload may destroy the entire phase and nullify its ("implicit") current limitation.

Applications that are critical to safety, for example electrically operated control surfaces or high-uplift surfaces (e.g., ailerons, landing flaps . . . ) of an aircraft depend on redundant and/or fault tolerant electrical drives. Redundant and/or fault-tolerant permanently excited electrical synchronous machines provide the highest power density and thus the lowest drive weight according to the state of the art. The drive must be able to continue running despite of short-circuited turns or coils in individual phases or phase groups of the PMSM. Typically these permanently excited electrical machines comprise redundant windings in which a physical and electromagnetic separation of coils that wind on alternating armature teeth is implemented.

For fault-tolerant electrical machines, a basic requirement for a standardized armature reactance of approximately 1.0 exists. Hence, the short-circuit current and the power dissipation of a short-circuited coil are limited to a tolerable value even in case of maximum motor speed. In addition to the short-circuit failure at the phase terminals, permanently excited machines with redundant windings should be tolerant to short-circuits in one or several turns (partial short-circuit). In this case the high total armature reactance does, however, not prevent an excessively high development of current and heat in the short-circuited turns.

Figure 4:
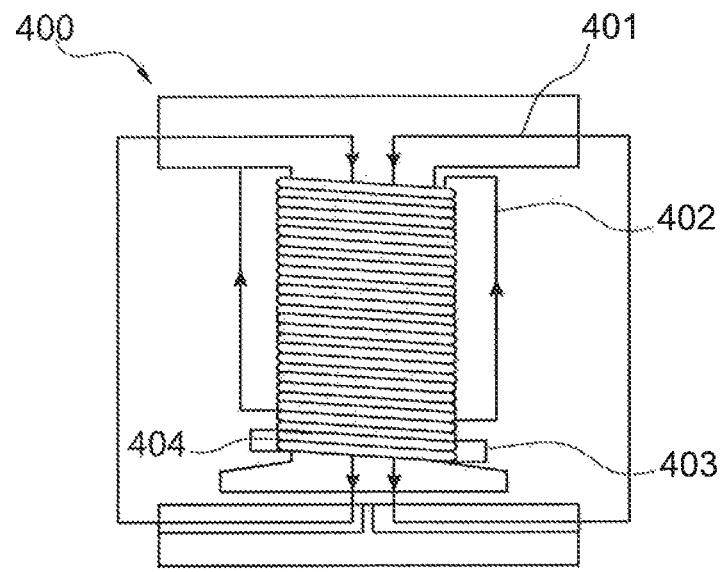
FIG. 4 shows a schematic view of an interturn short-circuit (partial short-circuit) in the winding of a stator tooth of an electric motor with an armature of an electric motor.

FIG. 4 schematically shows a partial short-circuit in a 1-phase coil 400 with a stator tooth of an electric motor, a coil winding and a rotor that is arranged in the lower section of FIG. 3 opposite of the armature. The coil is designed in such a manner that there is a magnetic flux linkage of all coil turns 401. In an upper section of the coil $N_1$ "functioning" coil turns with the flux leakage 402 are arranged. In a lower section of the coil there are $N_2$ "short-circuited" coil turns with the flux leakage 403. In the lower region of the coil there is a short-circuit between the coil turns 404.

$$x = \frac{N_2}{N_1}$$

In the above formula, the parameter x describes the ratio of the number of short-circuited turns $N_2$ to the number of "functioning" coil turns $N_1$.

Figure 5:
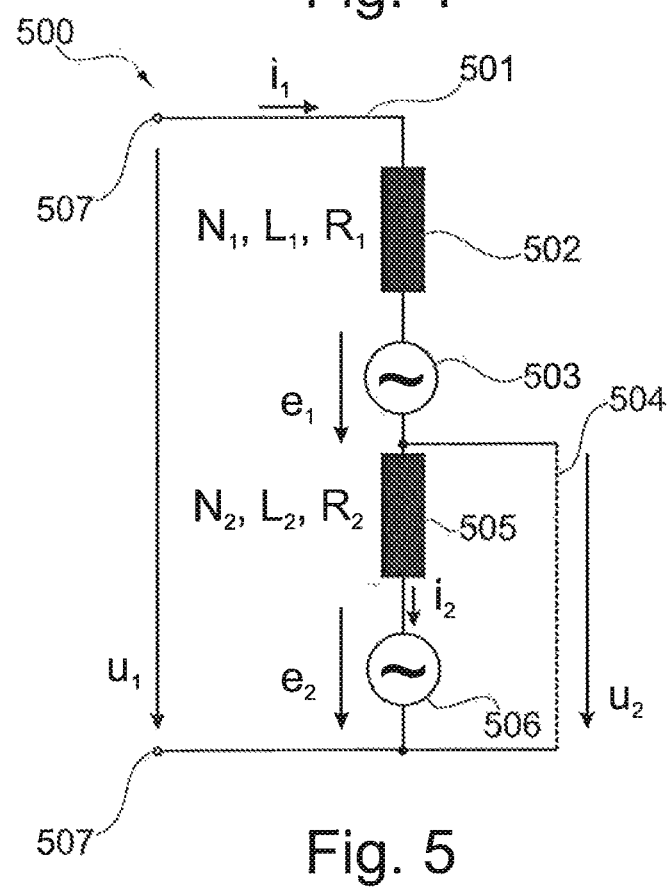
FIG. 5 shows the equivalent circuit diagram of a phase coil with an interturn short-circuit according to FIG. 4.

FIG. 5 shows an equivalent circuit diagram 500 of the subsystem shown in FIG. 4 and described above. The reference signs mentioned in FIG. 5 are explained in the following: $u_1$: phase terminal voltage; $i_1$: phase terminal current; $e_1$: induced voltage in "functioning" coil turns; $L_1$, $R_1$: self-inductance and resistance of the "functioning" coil turns; $u_2$=0: short-circuit voltage (zero); $i_2$: partial short-circuit current; $e_2$: induced voltage in "short-circuited" coil turns; and $L_2$, $R_2$: self-inductance and resistance of the "short-circuited" coils.

The equivalent circuit diagram of FIG. 5 comprises a "functioning" coil winding unit 502 with a number of functioning turns $N_1$, a self-inductance $L_1$ and a resistance $R_1$, which coil winding unit 502 is connected via a line 501 to a voltage source 507 and comprises an induced voltage $e_1$, 503. The analogue current circuit further comprises a coil winding section 505 with a number of short-circuited turns $N_2$ (short-circuit path: 504), a self-inductance $L_2$ and a resistance $R_2$, and an induced voltage $e_2$, 506.

A phase connection current $I_1$ flows through the functioning coil unit 502, and an interturn short-circuit current $I_2$ flows through the "short-circuited" coil turn unit 505. The voltage source 507 supplies the current circuit with a phase connection voltage of $u_1$. At the short-circuited coil turn unit a short-circuit voltage $u_2$ of 0 volt is present. The following shows equations for the currents in the two sections of the coil:

Functioning coil section:

$$R_1 \cdot i_1 + L_1 \frac{di_1}{dt} + M \frac{di_2}{dt} = u_1(t) - e_1(t)$$

Short-circuited coil section:

$$R_2 \cdot i_2 + M \frac{di_1}{dt} + L_2 \frac{di_2}{dt} = u_2(t) - e_2(t) = -e_2(t)$$

Where:
L=total inductance of the phase
R=total resistance of the phase
e(t)=total induced voltage of the phase $$k = \frac{L - L_S}{L} = \text{coupling coefficient } (L_S = \text{leakage inductance})$$

$$x = \frac{N_2}{N_1} = \text{coil turn ratio of short-circuited to functioning coil turns}$$

In case of a corresponding replacement of the parameters, the following interrelation results:

$$L_1 = L \cdot (1-x)^2 \; R_1 = R \cdot (1-x) \; e_1(t) = e(t) \cdot (1-x)$$

$$L_2 = L \cdot x^2 \; R_2 = R \cdot x \; e_2(t) = e(t) \cdot x$$

The occurrence of a motor fault may be better understood if the following case is assumed: the phase coil has open terminals 507 ($i_1$=0); the interturn short-circuit of $N_2$=x*$N_1$ is limited to a small part of the phase coil (x<<1). In this case the following applies:

$$M = k \sqrt{L_1 \cdot L_2} = k \cdot L \cdot x \cdot (1-x) \approx k \cdot L \cdot x$$

Assuming that the sinusoidal induced voltage:

$$e(t) = \hat{E} \cdot \cos(\omega_{el} t) = \sqrt{2} \cdot \omega_M \cdot \frac{k_T}{m} \cdot \cos(\omega_{el} t)$$

Where:
$k_T$=torque constant of the motor
m=number of phases
$\omega_M$=angular speed of the motor
$\omega_{el}$=angular frequency of the motor ($\omega_{el}$=ppz×$\omega_M$)
The interturn short-circuit current (rms value) is:

$$I_2 = \frac{E_2}{\sqrt{(\omega_{el} \cdot L_2)^2 + R_2^2}}$$

$$= \omega_M \cdot \frac{k_T}{m} \cdot \frac{x}{\sqrt{(\omega_{el} \cdot x^2 \cdot L)^2 + (x \cdot R)^2}}$$

$$= \frac{1}{m} \cdot \frac{\omega_M \cdot k_T}{\sqrt{(\omega_{el} \cdot x \cdot L)^2 + R^2}}$$

In case of a partial short-circuit the resulting short-circuit current in the short-circuited part of the winding is many times larger than the nominal current. As a result of the low inductance of the partial winding ($L_2$=$x^2$·L) the short-circuit current is only limited by the ohmic component of the winding resistance.

FIG. 6 shows a graphic illustration of the relative interturn short-circuit current 700 in a PMSM (permanently excited electric motor). The reference parameter is the short-circuit current in case that the entire winding at the terminals is short-circuited, with a vertical axis (701) that shows the relative short-circuit current from factor 0 to 80 701 and a horizontal axis (702) that shows the motor speed related to the nominal speed in per cent from 0 to 100% 702. Graph 703 shows the current flow at a ratio $x_1$ of short-circuited turns to functioning turns of 0.5%. Graph 704 shows the current flow at a ratio $x_2$ of short-circuited turns to functioning turns of 1%. Graph 705 shows the current flow at a ratio $x_3$ of short-circuited turns to functioning turns of 2%. The example shows that the local short-circuit current $I_2$ in case of an interturn short-circuit may be above the "normal" short-circuit current by a factor of 70. The parameters of the drive which forms the basis of FIG. 6 are the following:
m=9: number of coils (3×3)
$\omega_N$=133×2×p: 8000 rpm
ppz=7: 14-pole motor
r=0.06: total coil resistance (Q)
L=0.0077: total coil inductance (Henry)
Kt=0.62: torque constant (Nm/A)
The above-mentioned parameters also apply to the following FIG. 7, FIG. 8 and FIG. 9.

FIG. 7 shows the relative partial short-circuit current as a function of the percentage of the short-circuited turns relating to the total number of turns in the coil of a PMSM 900, with a vertical axis that shows the relative current relating to the "normal" short-circuit current, and a horizontal axis that shows the ratio of the short-circuited turns in relation to the total number of turns in per cent of 902 from 0.5 to 5%. Graph 903 shows the current flow relating to a nominal rotation speed of 1 wN. Graph 904 shows the current flow for half the nominal rotation speed of 0.5 wN. Graph 905 shows the current flow for a rotation speed of 0.25 wN.

FIG. 8 shows the initial heating rate of the short-circuited turns in case of an interturn short-circuit of a PMSM 1400 with a vertical axis 1401 that shows the heating rate from 0 to 1200 K/s, and a horizontal axis that shows the percentage of the short-circuited turns in relation to the total number of turns of the coil from 0.5 to 5%. Graph 1403 shows the heating rate at a rotation speed of 1 wN. Graph 1404 shows the heating rate at a rotation speed of 0.5 wN. Graph 1405 shows the heating rate at a rotation speed of 0.25 wN.

FIG. 9 shows the relative initial heating rate of the short-circuited turns in case of an interturn short-circuit of a PMSM 1500 with a vertical axis 1501 that shows the relative heating rate, and a horizontal axis 1502 that shows the percentage of the short-circuited turns in relation to the total number of turns of the coil from 0.5 to 5%. The initial heating rate in case of a "normal" short-circuit at the terminals is the reference parameter for the relative heating rate. Graph 1503 shows the heating rate at a rotation speed of 1 wN. Graph 1504 shows the heating rate at a rotation speed of 0.5 wN. Graph 1505 shows the heating rate at a rotation speed of 0.25 wN.

The excessive quantity of heat that develops in the short-circuited turns may damage the insulation layer or may even locally melt the conductor material. Fault propagation will occur with high probability. Early detection of a partial short-circuit in turns is therefore essential to initiate fault correction strategies before the fault propagates and possibly damages other phase coils or motor components. A short-circuit must be detected immediately, and the terminals of the corresponding subsystem must be short-circuited. This may be achieved in a simple manner by closing the associated "low side" semiconductor switch of the power converter (amplifier). The short-circuit current is limited to a non-critical nominal short-circuit current of the subsystem. All turns of the coil, not only a small percentage, contribute to the total magnetomotive force of the coil.

$$I_{K2} = \frac{E}{\sqrt{(\omega_{el} \cdot x \cdot L)^2 + R^2}}$$

$$I_K = \frac{E}{\sqrt{(\omega_{el} \cdot L)^2 + R^2}}$$

$$E = \omega_M \cdot \frac{k_T}{m}$$

The rapid and reliable detection of a partial short-circuit/interturn short-circuit is not easy. The terminal current that may be measured in the amplifier does not significantly change in case of a partial short-circuit/interturn short circuit. Detection methods may be based on the change in the self-inductance of the faulty coil, which may be detected by way of the terminal current waveforms, and in particular by way of the current ripple.

Figure 10:
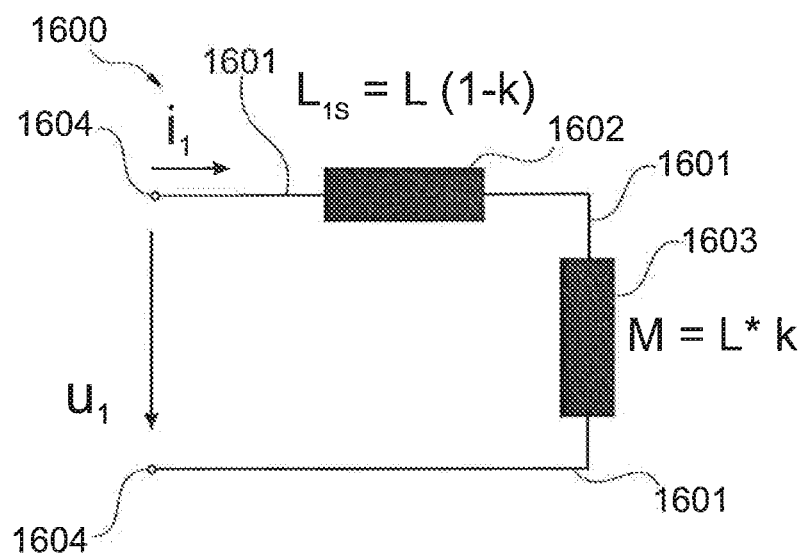
FIG. 10 shows a simplified equivalent circuit diagram of a phase coil of a PMSM without resistance and without induced voltages in the fault-free condition.
Figure 11:
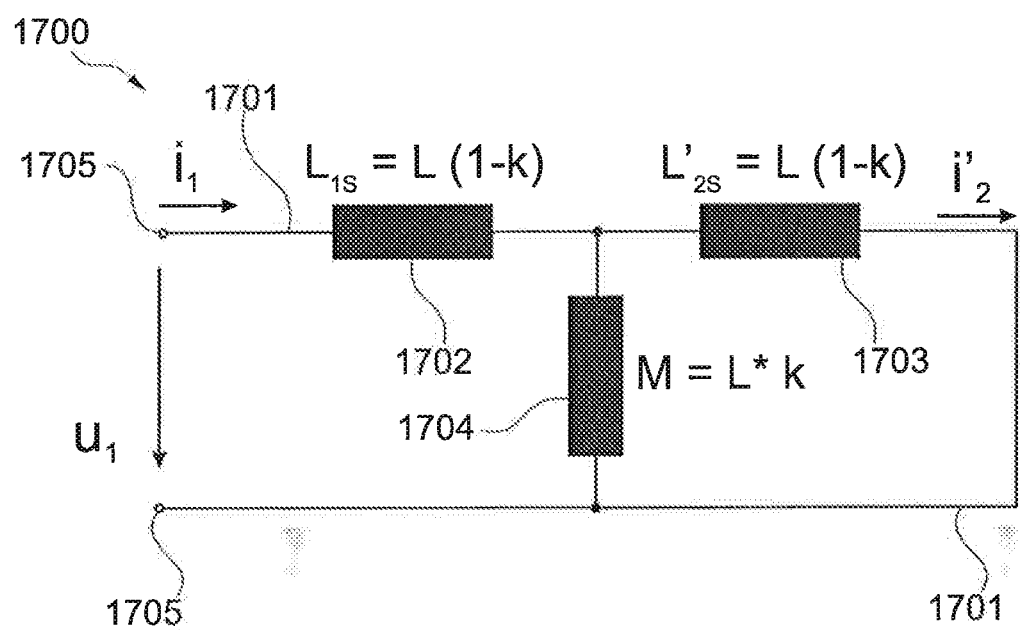
FIG. 11 shows a simplified equivalent circuit diagram of a phase coil of a PMSM without resistance and without induced voltages with a short-circuited secondary coil turn.

FIG. 10 and FIG. 11 each show a simplified equivalent circuit diagram of a phase coil of a PMSM without resistance and without induced voltages, which phase coil is divided into two partial windings with self-inductances and a coupling inductance (compare also FIG. 4) for the purpose of viewing the partial short-circuit fault (x=$N_2$/$N_1$<<1). The situation is similar to that of a transformer with a primary winding and a secondary winding, in which transformer the number of turns of the secondary winding is very much smaller than that of the primary winding, and wherein in FIG. 10 the terminals of the secondary winding are open, and in FIG. 11 they are short-circuited.

In a functioning state (FIG. 10) the coil inductance $L_1$ approximately equals the total inductance of the phase L, which total inductance may be measured at the terminals 1604. FIG. 10 shows a current circuit in a functioning state of the coil 1600 with terminals 1604 at which a voltage $u_1$ is applied, and through which terminals 1604 a current $i_1$ flows.

The equivalent circuit diagram comprises a leakage inductance $L_{1S}=L*(1-k)$ (k=coupling coefficient) of the primary winding 1602 and a coupling inductance $M=L*k$ 1603.

FIG. 11 illustrates the case of a phase coil with an interturn short-circuit 1700, with a voltage source $u_1$ 1705, as well as a primary-side leakage inductance $L_{1S}=L*(1-k)$ 1702 (leakage inductance of the intact winding section), a secondary-side leakage inductance $L'_{2S}=L*(1-k)$ 1703 (leakage inductance of the short-circuited winding section) and a coupling inductance $M=L*k$ 1704. The total inductance L, which may be measured at terminals 1604, and 1705, respectively, changes when the fault occurs. The change in the total inductance in case of a fault depends on the coupling coefficient k of the two partial windings:

$$L_{functioning}/L_{defective}=1-k^2$$

FIG. 12 shows the principle voltage curve over time in the supply of a motor phase 1800 with a PWM final stage. The graphic illustration according to FIG. 12 comprises a vertical axis 1801 for indicating the voltage U, and comprises a horizontal axis 1802 for indicating the time T. Graph 1803 shows a pulsed (pulse shaped) voltage curve over time $u_1$ (t) with a pulse duration of $t_e$.

FIG. 13 shows a simplified equivalent circuit diagram of said motor phase. FIG. 13 comprises a voltage source 1904 with a voltage $u_1$, as well as an inductance L 1902 that is connected to the voltage source 1904 via lines 1901, and an induced voltage E 1903. For the current circuit according to FIG. 13, driven with a voltage curve as shown in FIG. 12, the following formula interrelations apply:

PWM working cycle:

$$\tau_e = \frac{t_e}{T}$$

Induced voltage (EMF): $E=\tau_e \cdot U$
Current ripple (functioning):

$$\Delta i = \frac{U \cdot T}{L} \cdot \tau_e \cdot (1-\tau_e)$$

Current ripple (faulty):

$$\Delta i = \frac{U \cdot T}{L \cdot (1-k^2)} \cdot \tau_e \cdot (1-\tau_e)$$

In case of a fault, the current ripple is thus increased by the factor:

$$\frac{1}{1-k^2}$$

FIG. 14 shows the curve of the PWM voltage for a working cycle of 50% as well as the curve of the current ripple for a functioning current circuit and the current ripple in case of an interturn short-circuit in a PMSM 2000. The graphic illustration 2001 with a vertical axis 2002 that shows a voltage of 0 to 400 volts and a horizontal axis 2003 that shows the time from 0 to $2\times10^{-4}$ seconds describes the PWM voltage for a working cycle of 50% as a function of time 2010. The graphic illustration 2004 with a vertical axis 2005 that shows the current from 0 to 10 amperes and a horizontal time axis 2006 according to the time axis 2003 shows the current ripple as a function of time in a functioning current circuit 2011. The graphic illustration 2007 shows a vertical axis 2008 that shows the current in amperes according to the vertical axis 2005, and a horizontal time axis 2009 according to the time axis 2006 shows the magnified current ripple in case of an interturn short-circuit as a function of time 2012.

Figure 25:
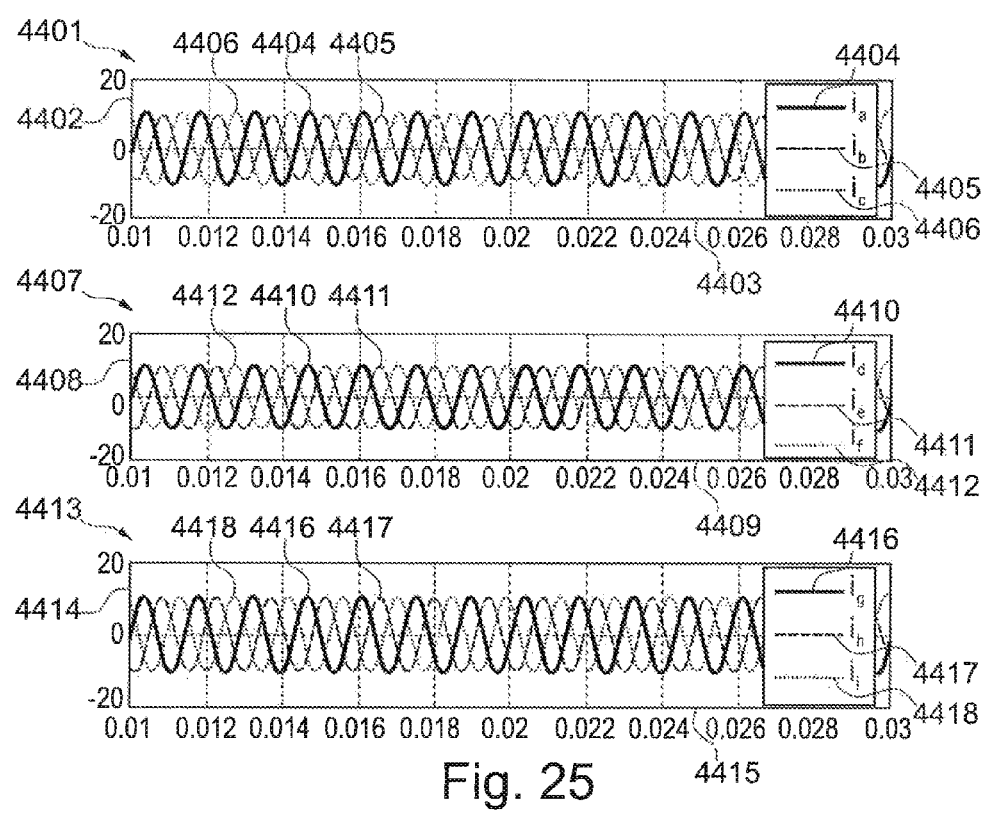
FIG. 25 shows graphic illustrations of phase currents A to I of an exemplary motor with a continuous-time voltage supply according to an exemplary embodiment.

FIG. 15 shows a PWM voltage relating to a working cycle of 25%, a current ripple in case of fault-free behavior of the current circuit, and a current ripple in case of an interturn short-circuit of a PMSM in relation to the time curve 2100. The graphic illustration 2101 with a vertical axis 2102 that shows the voltage curve from 0 to 400 volts, and a horizontal axis 2103 that shows the time curve from 0 to $2\times10^{-4}$ seconds describes the PWM voltage for a working cycle of 25% over time 2110. The graphic illustration 2104 with a vertical axis 2105 that shows the current curve from 0 to 10 amperes, and with a horizontal time axis 2106 according to the time axis 2103 shows a current ripple for a functioning current circuit over time 2111. The graphic illustration 2107 shows a vertical axis 2108 that shows the current curve according to the vertical axis 2105, and a horizontal time axis 2109 according to the time axis 2106 shows the magnified current ripple in case of an interturn short-circuit over time 2112. Hence, at separate PWM driving of the single phases, partial interturn short-circuits could in principle be detected by monitoring the current ripple that results from the PWM voltage circuit. However, evaluating the current ripple is not practicable for motors with three-phase star point topology, as will be shown in the following section (FIGS. 16, 25 and 26).

For FIGS. 14 and 22 described above, as well as for the following FIGS. 17 and 18, 19, 20, 21 and 22, the following parameters apply:
Phase inductance: L1=0.0077
Phase resistance: R1=0.06
Turns ratio: x=0.2
Coupling coefficient: k=0.8
DC bridge voltage: Uzk=270
PWM frequency: fp=40.000.

FIG. 16 shows a current circuit for an electric motor with three-phase star point topology 2300 with various voltage sources 2308, 2309, 2310 that in each case are connected via a line 2301 in each case to a coil 2302, 2304, 2306, each comprising an inductance $L_1$, $L_2$, $L_3$ and an induced voltage $E_1$, 2303, $E_2$, 2305, $E_3$, 2307. Through each one of the coils 2302, 2304, 2306 a corresponding current $i_1$, $i_2$, $i_3$ flows. For the current circuit according to FIG. 16 the following formula interrelations apply:
PWM working cycle:

$$\tau_e = \frac{t_e}{T}$$

Induced voltage (EMF): $E_1+E_2=\tau_e \cdot U$
Current ripple (functioning):

$$\Delta i = \frac{U \cdot T}{L_1+L_2} \cdot \tau_e \cdot (1-\tau_e)$$

Current ripple (faulty):

$$\Delta i = \frac{U \cdot T}{L_1 \cdot (1-k^2)+L_2} \cdot \tau_e \cdot (1-\tau_e)$$

With equal phase inductances (L1=L2) the current ripple in case of a fault only changes by the factor:

$$\frac{2}{2-k^2}$$

The change is thus significantly less than in case of a single-phase control.

FIG. 17 shows a PWM voltage curve in case of a working cycle of 50% as well as a current ripple for a functioning current circuit according to FIG. 16, and a current ripple for an interturn short-circuit for a current circuit according to FIG. 16 over a determined time curve 2400. The graphic illustration 2401 with a vertical axis 2402 that shows a voltage from 0 to 400 volts, and a horizontal axis 2403 that shows a time curve from 0 to 2×10⁻⁴ seconds, shows the PWM voltage curve in case of a working cycle of 50% over time 2410. The graphic illustration 2404 with a vertical axis 2405 that shows the current curve from 0 to 10 amperes, and a horizontal time axis 2406 according to the axis 2403, shows a current ripple in case of a current circuit according to FIG. 16, 2411 that functions without fault. The graphic illustration 2407 shows a vertical axis 2408 that shows a current curve according to the vertical axis 2405, and a horizontal time axis 2409 according to the time axis 2406 shows a current ripple in case of an interturn short-circuit 2412 for three-phase star point topology.

FIG. 18 shows a PWM voltage curve for a working cycle of 25%, a current ripple for a functioning current circuit as well as a current ripple in case of an interturn short-circuit over time for a current circuit according to FIG. 16 with three-phase star point topology 2500. The graphic illustration 2501 with a vertical axis 2502 that shows a current curve from 0 to 400 volts, and a horizontal axis 2503 that shows a time curve from 0 to 2×10⁻⁴ seconds describes the PWM voltage curve for a working cycle of 25% 2510. The graphic illustration 2504 with a vertical axis 2505 that shows the current from 0 to 10 in amperes, and a horizontal time axis 2506 according to the time axis 2503 shows a current ripple for a functioning current circuit 2511. The graphic illustration 2507 with a current axis 2508 according to the vertical current axis 2505 and a horizontal time axis 2508 according to the time axis 2506 shows a current ripple for an interturn short-circuit 2512 in case of a three-phase star point topology.

The differences in the current ripple for a functioning current circuit (2411 and 2511) and for an interturn short-circuit (2412 and 2512) may be detected only with difficulty. Thus, in case of a three-phase star point topology, the interturn short-circuit fault-detection exclusively by monitoring the current ripple of the terminal currents is practically hardly possible.

FIG. 19, FIG. 20, FIG. 21 and FIG. 22 show phase currents in DQ-controlled servo drives for 3×3 phases with star point topology, wherein only one phase group is shown. FIG. 19 shows a graphic illustration of phase currents in functioning phases 2600. A vertical axis 2601 designates the current from −20 to 20 amperes, a horizontal axis designates the time from 0.085 to 0.9 seconds, and the graphs 2603, $i_a$, 2604, $i_b$, 2605, $i_c$ represent the phase currents of the three-phases with star point topology. FIG. 20 shows a graphic illustration of the phase currents in case of a partial short-circuit fault in phase c 2700. The vertical axis 2701 shows a current in amperes according to the vertical axis 2601, the horizontal axis 2702 shows the time according to the horizontal time axis 2602, and the graphs 2703, $i_a$, 2704, $i_b$ and 2705, $i_c$ show the phase currents for the three phases $i_a$, $i_b$ and $i_c$. FIG. 21 shows an enlarged 2800 graphic illustration of the phase currents in functioning phases. The vertical axis 2801 shows the current from 0 to 20 amperes, the horizontal axis 2802 shows the time curve from 0.0865 to 0.0875 seconds and the graphs 2803, 2804, 2805 show the phase currents for the three phases $i_a$, $i_b$ and $i_c$. FIG. 22 shows the phase currents in an enlarged state with a fault in phase c 2900. The vertical axis 2901 is designed to be identical with the vertical axis 2101 and shows the current in amperes; the horizontal axis 2902 is designed to be identical with the horizontal axis 2802 and shows the time. The graphs 2903, 2904 and 2905 show the phase current for the three phases $i_a$, $i_b$ and $i_c$ in case of a fault in phase c. The phase currents illustrated in FIG. 19, FIG. 20, FIG. 21 and FIG. 22 show that in case of a fault the current ripple increases only slightly and the current distribution becomes slightly asymmetrical. Detection of the partial short-circuit by evaluating the current curves is thus not practicable in case of star point topology.

According to the following exemplary embodiment, partial short-circuit/interturn short-circuit faults are detected in that the star point potential is returned to an evaluation unit. In the evaluation unit this potential is compared to a reference potential, and the potential difference between the star point potential and the reference potential is evaluated. The reference potential may be calculated and compared to the measured star point potential, or the reference potential may be generated analogously by a suitable circuit and may also be fed to the evaluation unit, in which subsequently the potential difference between the star point and the reference potential is measured.

Figure 23:
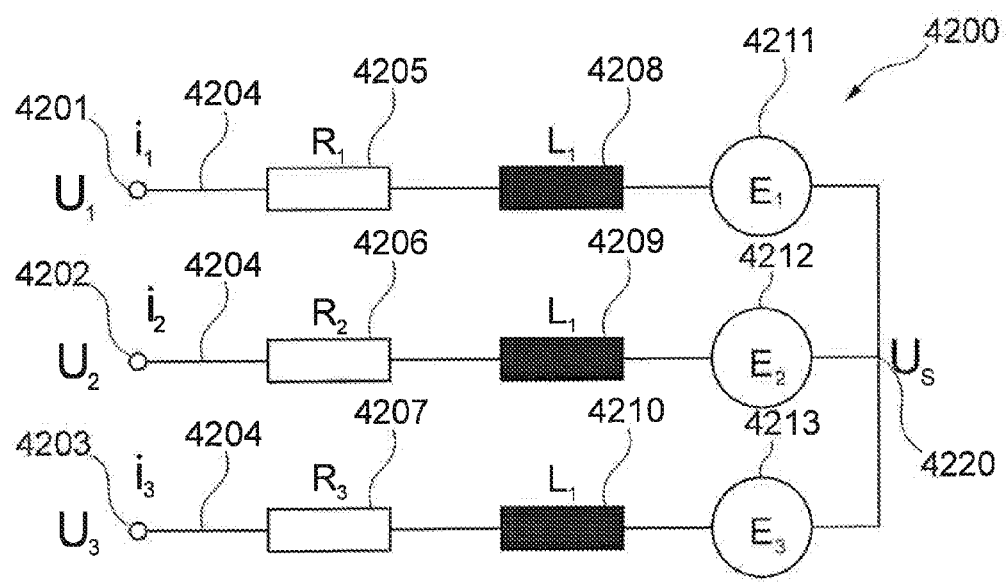
FIG. 23 shows a schematic illustration of a circuit with three-phase star point topology according to an exemplary embodiment.

FIG. 23 shows a schematic view of a circuitry with three-phase star point topology 4200. Voltage sources $U_1$, 4201, U2, 4202, U3, 4203 supply via lines 4204 corresponding coils with resistances $R_1$, 4205, $R_2$, 4206, $R_3$, 4207 and inductances $L_1$, 4208, $L_2$, 4209, $L_3$, 4210, wherein corresponding currents $i_1$, $i_2$, $i_3$ flow through the corresponding coils. Each coil comprises a corresponding induced voltage $E_1$, 4211, $E_2$, 4212, $E_3$, 4213, and is connected via lines 4204 to a star point 4220 at which the potential $U_S$ occurs. The star point potential of a symmetric m-phase system with m motor phases may be assumed as well-known for the fault-free operating state (calculation and/or measurement at reference system).

$$R_1 = R_2 = R_3 = R$$

$$L_1 = L_2 = L_3 = L$$

The following applies due to symmetry:

$$\sum_{m=1}^{3} E_\mu = 0$$

The following applies at the current node:

$$\sum_{m=1}^{3} i_\mu = 0$$

a. $U_S = U_1 + R \cdot i_1 + L \cdot \dfrac{di_1}{dt} - E_1$ b. $U_S = U_2 + R \cdot i_2 + L \cdot \dfrac{di_2}{dt} - E_2$ c. $U_S = U_3 + R \cdot i_3 + L \cdot \dfrac{di_3}{dt} - E_3$ The sum of the voltages is:

$$3 \cdot U_S = U_1 + U_2 + U_3 + R \cdot \sum i + L \cdot \frac{d}{dt}\left(\sum i\right) - \sum E$$

$$U_S = \frac{U_1 + U_2 + U_3}{3}$$

In case of known voltages (e.g., from the current switching state of a PWM 3-phase bridge circuit) the star point potential for symmetrical conditions may be calculated directly, or may be generated by an analog circuit with three identical measuring resistors (reference voltage).

Figure 24:
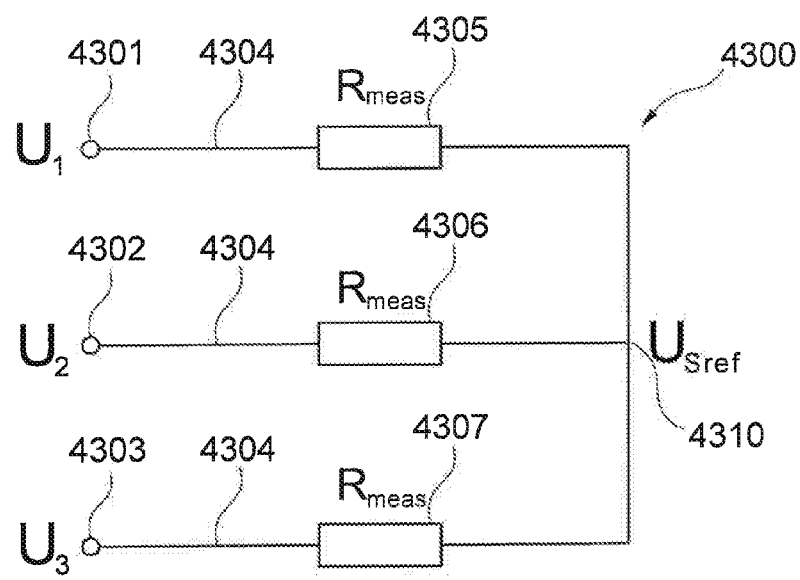
FIG. 24 shows a schematic view of a circuit for a reference potential 4300 according to an exemplary embodiment.

FIG. 24 shows a circuit for a reference potential 4300 with three input voltages $U_1$, 4301, $U_2$, 4302, $U_3$, 4303 that are connected via lines 4304 to measuring resistors $R_{meas}$ 4305, 4306, 4307. The measuring resistors $R_{meas}$ 4305, 4306, 4307 are interconnected via lines 4304, such that at the connecting point, the star point 4310, a reference voltage $U_{Sref}$ may be measured.

According to an exemplary embodiment, the terminal voltages of the star point system to which the reference potential relates are used as input voltages. Faults, and in particular also interturn short-circuit faults in one or several motor phases (f<m) result in a systematic deviation of the star point potential from the potential of the reference system.

Already from the equations mentioned above it is evident, that each deviation from the required symmetry conditions must lead to a potential difference between $U_s$ and $U_{sref}$. In the primarily considered fault-tolerant permanently-excited synchronous motors for aviation applications, the voltage drop at the ohmic phase resistor R is very small in relation to the voltage drop at the phase inductance. The phase inductance is intentionally selected to be large, because in case of a fault (detected interturn short-circuit) the total phase group is to be short-circuited and the resulting short-circuit current is then to remain small. It is thus primarily the asymmetry of the inductances that is clearly detected by the potential comparison.

By a comparison of the star point potential with the reference potential fault states may be detected, and thus, in particular, also interturn short-circuits in one or several motor phases (f<m) of the group of motor phases. As already stated elsewhere, in case of an interturn short-circuit the total inductance of the affected phase changes. Correspondingly, the inductive voltage drop $$L \cdot \frac{di}{dt}$$

at the phase concerned is reduced, and the star point potential changes with respect to the reference potential. The comparison between the actual star point potential and the reference signal may then be realized either in analog circuit technology or after A/D conversion in the control computer.

The influence of the interturn short-circuit on other measurable parameters, in particular on the phase current, which is measured anyway, is very small, and difficult to detect, respectively. While in case of individual control of a winding phase the case of an interturn short-circuit with PWM control may be detectable from the "current ripple", in case of arrangements with a star point this effect is watered down to the extent that a detection by evaluating the currents is practically impossible. The detection method is suitable both for a continuous-time voltage supply and for a switched voltage supply (PWM) of the group of motor phases.

The following figures show the behavior of the exemplary motor with a final stage that operates in a continuous-time manner under the following boundary conditions: rotation speed 100 1/s, torque=0.5*nominal torque, interturn short-circuit in phase c of phase group a, b, c difference of the phase inductance in phase f by 10%, (group d, e, f) difference of the phase resistance in phase i by 10%, (group g, h, i).

FIG. 25 shows phase currents a to i of an exemplary motor with a continuous-time voltage supply (no PWM). The graphic illustration 4401 shows phase current curves of the phases a, b, c with a vertical axis 4402 that shows the current from −20 to 20 amperes, and a horizontal axis 4403 that shows the time course from 0.01 to 0.03 seconds. Graph 4404 shows the current curve of the phase $i_a$. Graph 4405 shows the current curve of the phase $i_b$. Graph 4406 shows the current curve of the phase $i_c$ with an interturn short-circuit.

The graphic illustration 4407 with a vertical axis 4408 according to the vertical axis 4404 and a horizontal axis 4409 according to the horizontal axis 4403 shows the phase current curve of the phases d, e, f. Graph 4410 shows the current curve of the phase $i_d$, graph 4411 shows the current curve of the phase $i_e$, and graph 4412 shows the current curve of the phase $i_f$ with the difference in the phase inductance.

The graphic illustration 4413 shows the phase current curve of the phases g, h, i. The vertical axis 4414 corresponds to the vertical axis 4402, and the horizontal axis 4415 corresponds to the horizontal axis 4403. Graph 4416 shows the current curve of the phase $i_g$, graph 4417 shows the current curve of the phase $i_h$, and graph 4418 shows the current curve of the phase $i_i$ with the difference in the phase resistance.

From FIG. 25 no information in the current curves is detectable that may be evaluated. FIG. 26 shows the fault voltage of an exemplary motor with a continuous-time voltage supply for the phases A to I. The graphic illustration 4601 shows the potential difference between the star point potential and the reference potential for the phases a, b, c, 4601. The vertical axis 4602 shows the potential difference from −20 to 20 volts, and the horizontal axis 4603 shows the time course from 0.01 to 0.03 seconds.

Graph 4604 shows the difference of the star point potential compared with a reference potential for the phases a, b, c, wherein in phase c an interturn short-circuit is present. The graphic illustration 4605 shows the potential difference between star point potential and reference potential for the phases d, e, f wherein in phase f the phase inductance differs by 10%. The graphic illustration 4606 shows the potential difference between star point potential and reference potential over time for the phases g, h, i, wherein in phase i the phase resistance differs by 10%.

According to two exemplary embodiments, in case of a switched supply by a PWM amplifier for fault detection, optionally, both the momentary values of the potential difference, and the measured values, smoothed by a filter, (moving averages) of the potential differences may be used. Normally the phases are supplied by PWM final stages (a half-bridge per phase). In this case, the star point potential changes with each switching edge. If one disregards the voltage drop at the switch, only 4 discrete states result between the switching edges for the reference star point potential, depending on the intermediate-circuit voltage UZK:
3 half-bridges at low potential: $U_{Sref}=0$
2 half-bridge(s) at low potential: $U_{Sref}=UZK/3$
1 half-bridge at low potential: $U_{Sref}=2*UZK/3$
3 half-bridges at UZK potential: $U_{Sref}=UZK$
In case of a fault, the actually measurable star point potential deviates from these values.

Figure 27:
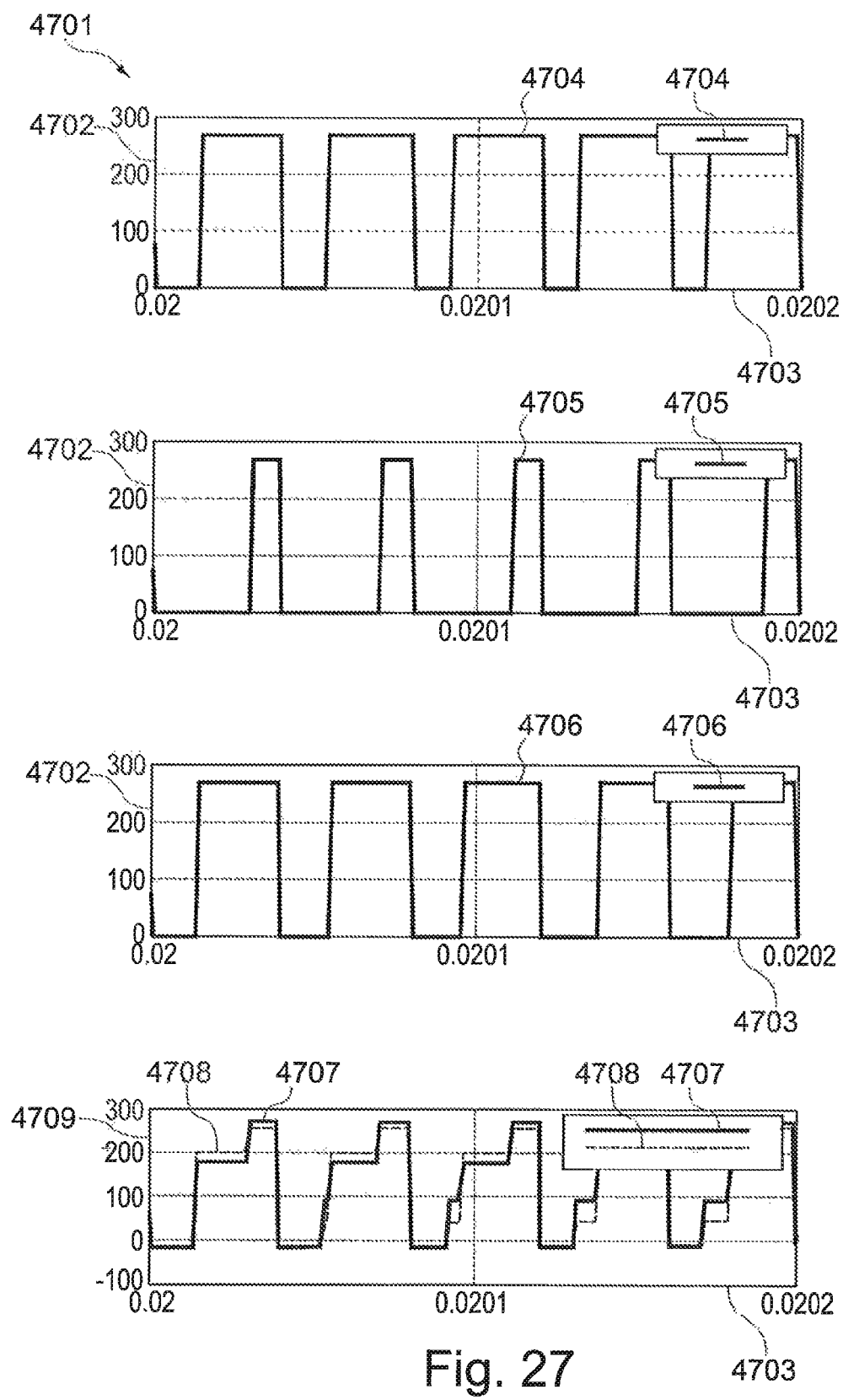
FIG. 27 shows three graphic illustrations of the three drive voltages U1, U2 and U3 of a star point system of an exemplary motor with a partial short-circuit fault, and a graphic illustration for the star point potential of the associated star point in case of a switching PWM voltage supply and the respective reference potential according to an exemplary embodiment.

FIG. 27 shows four graphic illustrations of drive voltages and star point reference star point potentials 4701 which result between the switching edges depending on the intermediate-circuit voltage UZK, wherein the vertical axes 4702 show the voltage from 0 to 300 volts, the vertical axis 4709 shows the voltage from −100 to 300 volts, and the horizontal axes 4703 show the time course from 0.02 to 0.0202 seconds.

Graph 4704 shows the PWM voltage curve for the terminal of the PWM-phase a. Graph 4705 shows the PWM voltage curve for the terminal of the PWM-phase b. Graph 4706 shows the PWM voltage curve for the terminal of the PWM-phase c. Graph 4707 shows an ideal curve of the star point potential, while graph 4708 shows the curve of the star point potential measured in case of a partial short-circuit in phase c. The graphic illustration of the graphs 4707 and 4708 comprises a vertical axis 4709 that shows the voltage from −100 to 300 volts. The time curve of the unfiltered fault signals (difference between the ideal and the measured star point potential) for a somewhat longer period of time is shown in FIGS. 28 and 29 in different zoom views.

FIG. 28 shows the unfiltered difference in the star point potential for the phases a, b, c, the phases d, e, f, and the phases g, h, i, wherein the vertical axes 4802 show the potential difference from −100 to 100 volts, and the horizontal axes 4803 the time course from 0.01 to 0.03 seconds. Graph 4804 shows the curve of the difference in the star point potential for the phases a, b, c with an interturn short-circuit in phase c. Graph 4805 shows the curve of the difference in the star point potential for the phases d, e, f with an inductance difference (10%) in phase f. Graph 4806 shows the curve of the difference in the star point potential for the phases g, h, i with a difference in resistance (10%) in phase i.

FIG. 29 shows the unfiltered curve of the difference in the star point potential 4901 for the phases a, b, c, the phases d, e, f and the phases g, h, i. The vertical axes 4902 show the potential difference from −100 to 100 volts and the horizontal axes 4903 show the time curve from 0.02 to 0.021 seconds. Graph 4904 shows the unfiltered curve of the difference in the star point potential for the phases a, b, c. Graph 4905 shows the unfiltered curve of the difference in the star point potential for the phases d, e, f. Graph 4906 shows the unfiltered curve of the difference in the star point potential for the phases g, h, i.

The width of the impulse-shaped fault voltages depends on the distance between the switching edges, and in case of small voltage-related fundamental wave-amplitudes (i.e., in case of low rotation speeds) said width becomes very narrow. This is at least the case when the PWM control of the 3 half-bridges of a star point system occurs in a synchronized manner and without phase shift, i.e. for example the falling edge of each PWM cycle occurs simultaneously at all 3 half-bridges (see FIG. 27). In case of small voltage amplitudes the PWM ratio of all the half-bridges differs only slightly from 50%, and thus the rising edges, too, "arrive" almost at the same time.

According to an exemplary embodiment, by suitable modification of controlling the half-bridges, even in case of low voltage amplitudes (PWM ratio approximately 50% at all the half-bridges), the width of the impulse-shaped fault voltages may be increased, for example by: setting a phase shift of, for example, in each case 120° between the synchronized PWM of the three half-bridges; non-synchronized PWM, i.e., beat of the points in time of switching of the individual half-bridges against each other.

While in this manner it is theoretically possible to detect the voltage differences between the switching edges, in practice this is expensive to implement. Another difficulty is presented by the vibrations of parasitic oscillation circuits, triggered by the switching edges (e.g. generated by a parasitic C to ground at the star point), which may not decay within the brief time windows available for measuring. Depending on their resonance frequency and attenuation, the measured star point voltage will also be difficult to filter. In contrast to this if the curve of the fault signal is smoothed by a low-pass filter, a quasi-continuous fault signal results, whose amplitude is easy to evaluate (FIG. 30).

FIG. 30 shows a filtered fault signal 5001, wherein in three graphic illustrations star point-differential-potential-filtered curves of the difference in the star point potential for the phases a, b, c, the phases d, e, f and the phases g, h, i are shown. The vertical axes 5002 show the potential difference from −10 to +10 volts, and the horizontal axes 5003 show the time course from 0.01 to 0.03 seconds. Graph 5004 shows the curve of the difference in the star point potential in the filtered state for the phases a, b, c, wherein in phase c an interturn short-circuit is present. Graph 5005 shows the filtered curve of the difference in the star point potential of the phases d, e, f, wherein in phase f the winding inductance differs by 10%. Graph 5006 shows the curve of the difference in the star point potential in the filtered state for the phases g, h, i, wherein in phase i the winding resistance differs by 10%. It should be noted that, apart from a small ripple, the curve of the smoothed fault signal exactly corresponds to the fault signal that would arise in case of an final stage that operates on a continuous-time basis (FIG. 26).

An expansion of the method enables the fault detection even in cases where "natural" excitation of the multi-phase system is absent or too low. At a standstill or at low motor rotation speed the fundamental-wave amplitudes of the phase voltages are too low for generating a fault signal that may be evaluated in a practical way. In this case the phase group may be excited in a directed manner by the impression of reactive currents. This enables reliable fault detection without generating interfering torque pulsation.

It may be demonstrated that the amplitude of the fault signal does not depend on the torque load or current load, but on the frequency (rotation speed) and voltage of the motor. At low rotation speed and correspondingly low (medium) motor voltage the fault signal therefore without any further measures becomes so small that it is practically no longer usable.

FIG. 31 shows the filtered curve of the difference in the star point potential at low rotation speed and correspondingly low motor voltage for a fault signal for the phases a, b, c, the phases d, e, f and the phases g, h, i. The vertical axes 5102 show the potential difference from −10 to +10 volts, and the horizontal axes 5103 show the time curve from 0.01 to 0.03 seconds. Graph 5104 shows the curve of the difference in the star point potential for the phases a, b, c with an interturn short-circuit in phase c. Graph 5105 shows the curve of the difference in the star point potential for the phases d, e, f with an inductance difference in phase f. Graph 5106 shows the curve of the difference in the star point potential for the phases g, h, i with a difference in resistance in phase i.

FIG. 31 shows the fault voltages at a rotation speed reduced from 100 l/s to 10 l/s. At this, it is no longer possible to obtain a sensible practical evaluation, let alone at even lower rotation speeds.

According to an exemplary embodiment, therefore a relatively high-frequency reactive current is impressed in a directed manner in the stator winding. Due to the high winding inductance this also requires substantial voltage amplitudes at the terminals. The reactive current does not contribute to torque generation and may thus not be felt at the motor shaft.

According to an exemplary embodiment, a practical option of generating this reactive current is to use the current control, which most of the time is present anyway, in d/q coordinates. In this known method, by coordinate transformations, the torque-forming active current Iq and the field-forming reactive current Id are regulated separately. Accordingly, there are separate setpoint values and actual values for the active current Iq and the reactive current Id.

According to an exemplary embodiment, the desired excitation is generated in that at low rotation speeds, instead of the setpoint value zero, a (for example sinusoidally) modulated setpoint signal is given to the Id controller.

FIG. 32 shows a schematic view of a control method for fault detection at low motor rotation speed for a PMSM with star point topology 5200. A speed control device 5206 evaluates a setpoint motor speed wsetpoint 5203 with respect to an actual motor speed wm 5205. The speed control device 5206 is connected to current control units 5208, 5209, 5210 via lines 5207, and feeds a reference current iq_ref to these units. The current control units 5208, 5209, 5210 are connected to a power stage and a PMSM 5211 via lines, and supply it with respective phase voltages v_abc, v_def, v_ghi. A load 5218 is connected to the PMSM 5211. Furthermore, several measuring points 5212 to 5217 are connected to the power stage and the PMSM 5211, in particular measuring points for the phase currents 5212, the angle position of the motor shaft 5215 and the actual motor speed 5213. A switch 5220 guides either the signal 0 5212 or sinusoidal excitations 5223 to the current control units 5208, 5209, 5210. The switch-over may, for example, take place depending on the motor rotation speed 5222. The signal emitted by the switch 5220 to the current control units 5208, 5209, 5210 is designated a modulated setpoint signal 5224. As a result of the arrangement according to FIG. 32 a fault signal is obtained the maximum amplitude and frequency of which result from the voltage required for generating the reactive current, as is shown in FIG. 33.

FIG. 33 shows a curve of the difference in the star point potential, whose structure corresponds to that of FIG. 32, for the phases a, b, c, the phases d, e, f and the phases g, h, i of a PMSM 5300. The vertical axes 5301 designate the potential differences from −10 to 10 volts, and the horizontal axes 5302 designate the time course from 0.01 to 0.03 seconds. Graph 5303 shows the filtered curve of the difference in the star point potential for the phases a, b, c, wherein in phase c an interturn short-circuit is present. Graph 5304 shows the filtered curve of the difference in the star point potential for the phases d, e, f, wherein in phase f the winding inductance differs by 10%. Graph 530 shows the filtered curve of the difference in the star point potential for the phases g, h, i, wherein in phase i the winding resistance differs by 10%.

In addition to the frequency of the reactive current excitation (as described in FIG. 32) these fault signals are amplitude-modulated with the motor frequency resulting from the rotation speed, or depending on the rotor position. FIG. 33 shows that an evaluation and thus fault detection is possible. There is a disadvantage in the additional requirement for reactive power, which is, however, quite within reasonable limits. Likewise, the required reactive current amplitudes are within reasonable limits.

According to an exemplary embodiment, the disadvantage may be minimized in that switching is not continuously activated, but only in discrete, short time intervals as "bursts". In this way the additional motor losses may be reduced to a minimum. The following figures show the effect of the measure to the phase currents.

Figure 34:
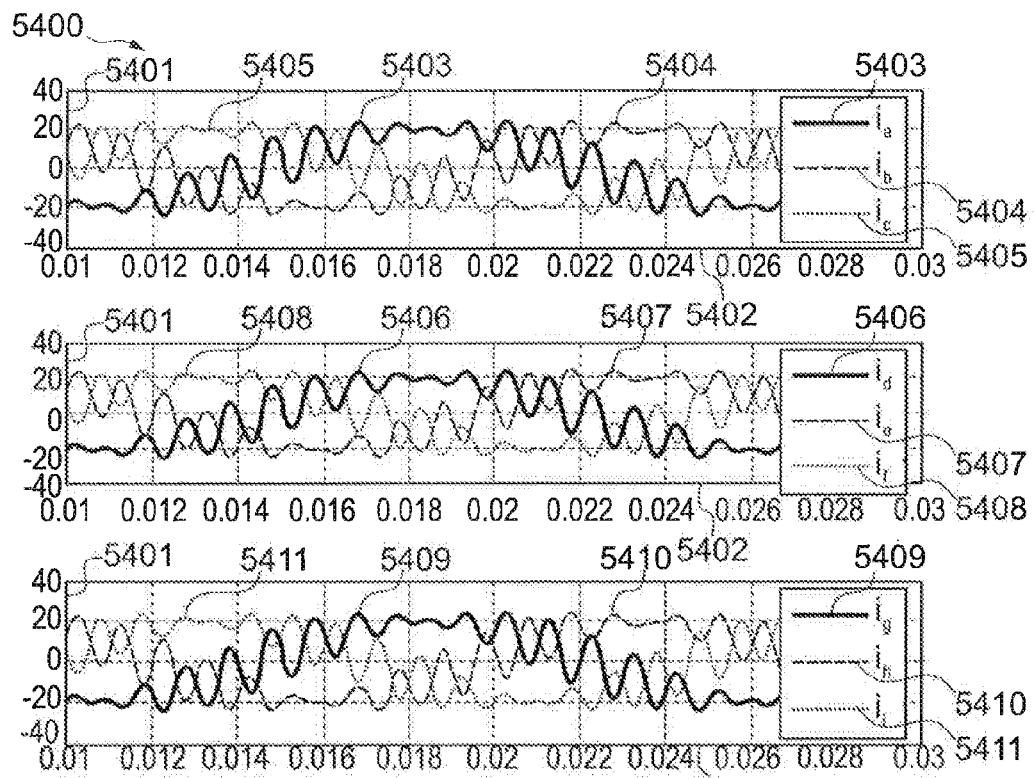
FIG. 34 in three graphic illustrations shows phase currents with superimposed higher-frequency reactive current components for the phases of a PMSM according to an exemplary embodiment.

FIG. 34 shows phase currents with superimposed higher-frequency reactive current components 5400 for the phases a, b, c, for the phases d, e, f and for the phases g, h, i of the PMSM described above. The vertical axes 5401 show the current course from −40 to +40 amperes, and the horizontal axes 5402 show the time course from 0.01 to 0.03 seconds. Graph 5403 shows the phase current curve of the phase $i_a$, graph 5404 shows the phase current curve of the phase $i_b$ and graph 5405 shows the phase current curve of the phase $i_c$. Graph 5406 shows the phase current curve of the phase $i_d$, graph 5407 shows the phase current curve of the phase $i_e$, and graph 5408 shows the phase current curve of the phase $i_f$. Graph 5409 shows the phase current curve of the phase $i_g$, graph 5410 shows the phase current curve of the phase $i_h$, and graph 5411 shows the phase current curve of the phase $i_i$.

Figure 35:
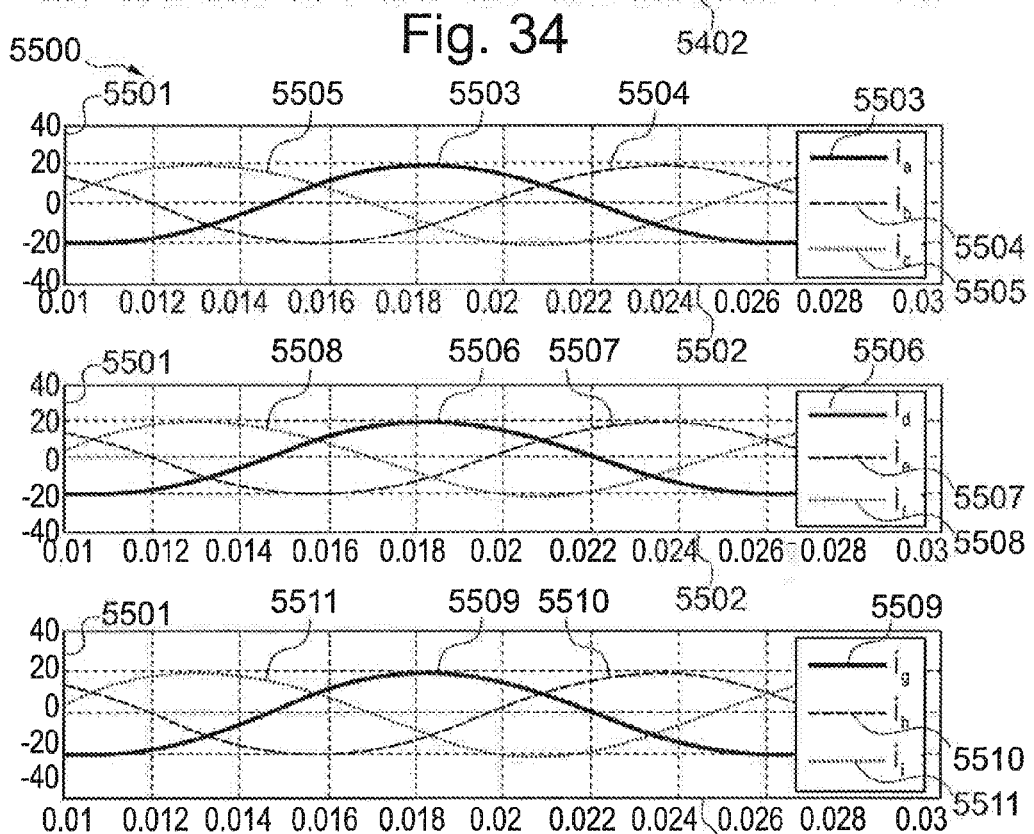
FIG. 35 in three graphic illustrations shows the phase currents without superimposed higher-frequency reactive current components for the phase currents of a PMSM according to an exemplary embodiment.

FIG. 35 shows the active currents without the superimposed reactive current component 5500 for the phase currents a, b, c, the phase currents d, e, f, and the phase currents g, h, i of the PMSM described above. The vertical axes 5501 show the current course from −40 to +40 amperes, and the horizontal axes 5502 show the time course from 0.01 to 0.03 seconds. Graph 5503 shows the phase current curve for the phase $i_a$, graph 5504 shows the phase current curve for the phase $i_b$, and graph 5505 shows the phase current curve for the phase $i_c$. Graph 5506 shows the phase current curve of the phase $i_d$, graph 5507 shows the phase current curve of the phase $i_e$, and graph 5508 shows the phase current curve of the phase $i_f$. Graph 5509 shows the phase current curve of the phase $i_g$, graph 5510 shows the phase current curve of the phase $i_h$, and graph 5511 shows the phase current curve of the phase $i_i$. It is again emphasized that the superposition of the reactive currents does not have any influence on the torque generated by the phase groups.

According to a further exemplary embodiment, measuring the star point potential may occur without there being a measuring line to the star point. If both transistors of a half-bridge of the star point system are switched to high impedance (e.g., the transistors to terminal 1 in FIG. 23), the current in this branch of the star point system quickly dissipates. Subsequently, measuring the voltage at terminal 1 suggests the star point potential. This method may be carried out sequentially at all 3 terminals of the star point system. In this manner, by using the control lines one may gain access to the star point voltage without having to feed this potential back to the electronic unit by a separate measuring line. Measuring the voltage at a terminal of a star point system in whose associated half-bridge both transistors are concurrently switched to high impedance is also used in common methods for sensorless commutation of BLDC motors. Ideally, such a phase is inserted in the region of the regular current-zero crossing in the star point branch concerned. Any "residual current" that may be flowing then dissipates particularly quickly. The measured voltage for i1=0 and di1/dt=0 may be derived from the voltage equations $$U_S = U_1 + R \cdot i_1 + L \cdot \frac{di_1}{dt} - E_1;$$
$$U_S = U_2 + R \cdot i_2 + L \cdot \frac{di_2}{dt} - E_2;$$
$$U_S = U_3 + R \cdot i_3 + L \cdot \frac{di_3}{dt} - E_3;$$

U1=Us+E1 (as an example for terminal 1).

If the star point system is part of an electronically commuted synchronous motor that is not operated in the field weakening, then the zero crossing of the current i and of the induced voltage E occur concurrently in any branch of the star point system. Thus in the time domain of the current zero crossing of $i_1$ the voltage $E_1$ is very low, and the measured potential $U_1$ almost corresponds to the star point potential $U_S$. Analogously, in each case electrically phase-shifted by 120°, the star point potential is accessible to a measurement at the terminals $U_2$ and $U_3$.

According to a further exemplary embodiment, the described method may also be applied for field-weakening operation, where the zero crossings of the current and the induced voltage are no longer in phase, in that, for example, in the control computer of the motor electronics an observer algorithm for the motor is included in real time in the calculations. The voltage measuring, for example at terminal $U_1$, continues to occur in the region of the current zero crossing of $i_1$ with two transistors, switched to high impedance, in the associated half-bridge. The corresponding value from the observer algorithm is used as a momentary induced voltage $E_1$ in branch 1 of the star point system. The star point potential is calculated as $U_s=U_1-E_1$ (as an example for terminal 1).

Figure 36:
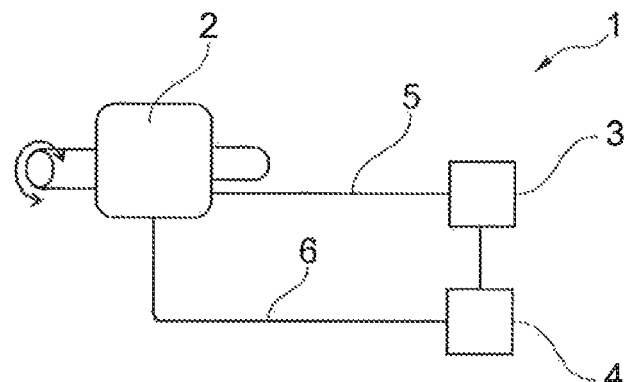
FIG. 36 shows a schematic view of a detection and control device according to an exemplary embodiment.

FIG. 36 shows a schematic view of a detection and control device 1 with an electric motor 2 with a star point topology for detecting a motor fault of the electric motor 2. The electric motor 2 of the detection and control device 1 is connected via a return unit 5 to an evaluation unit 3, and is connected via control lines 6 to the control unit 4. By way of the return unit 5 a star point potential of the electric motor 2 is returned to the evaluation unit 3. The evaluation unit 3 evaluates the star point potential. The control unit 4 is connected to the evaluation unit 3 and is used for passivation of a motor fault on the basis of the evaluation by the evaluation unit 3. By the expansion of the method, as described in the preceding paragraph, the return unit 5 may be omitted, and the control unit 4 and evaluation unit 3 may be combined.

Figure 37:
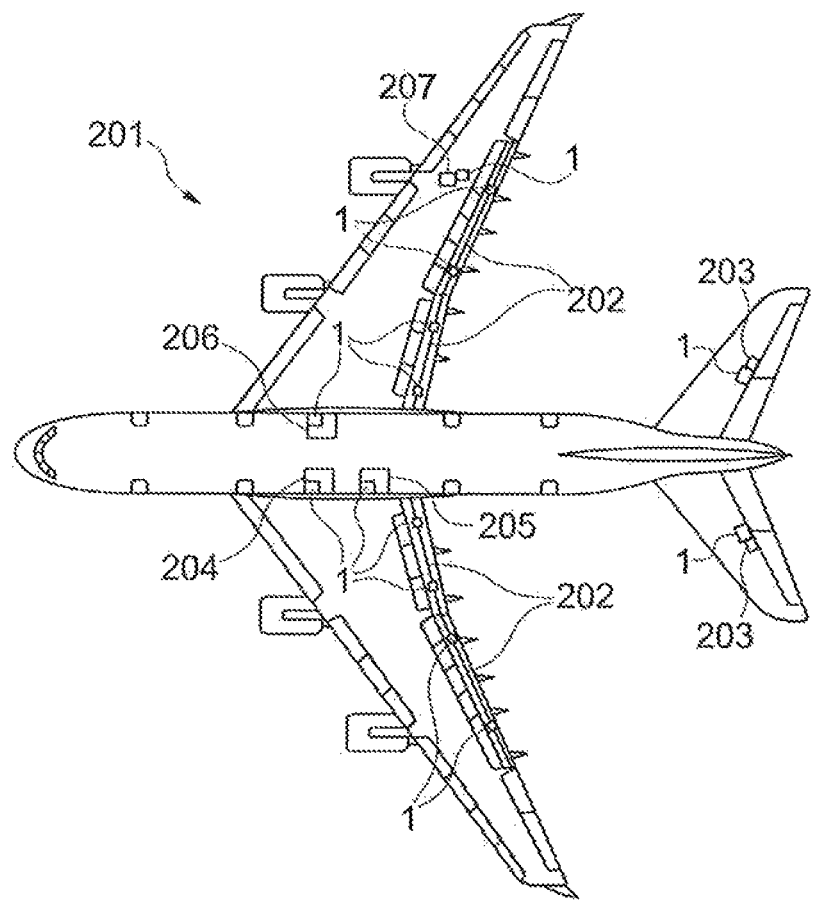
FIG. 37 shows a schematic top view of an aircraft with several detection and control devices according to an exemplary embodiment.

FIG. 37 shows a schematic top view of an aircraft 201 with several detection and control devices 1. Several landing flap drive systems 202 with several detection and control devices 1 are attached to the wings of the aircraft. In the rear of the aircraft, in the region of the elevator of the aircraft, actuators 203 with detection and control devices 1 are arranged. In the fuselage region of the aircraft, in each case a compressor motor 204 (for example for a turbine or a cabin air conditioning system), a pump motor 205 (for example for fuel, coolant and/or hydraulics) as well as an electrical generator 206, each comprising a detection and control device 1, are arranged. At a wing of the aircraft 201 a fan drive or propeller drive 207 with a detection and control device 1 is arranged. The actuator(s) 203, compressor motor 204, pump motor 205, electrical generator 206 as well as fan drive and propeller drive 207 may also be arranged in other regions of the aircraft 201 and may also be designed individually for themselves or in some other means of transport with a detection and control device 1.

Figure 38:
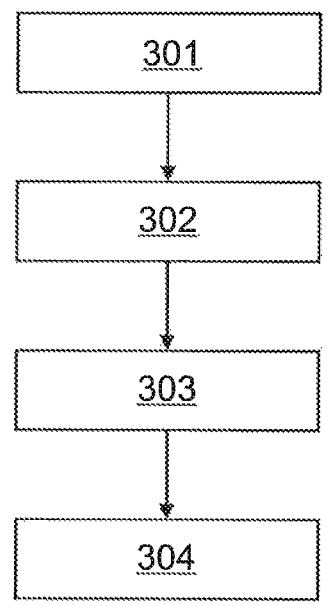
FIG. 38 shows a flow chart of a method according to an exemplary embodiment.

FIG. 38 shows a flow chart of a method for detecting a motor fault of an electric motor 2 with star point topology. In a first step, providing an evaluation unit 3, a control unit 4 and a return unit 5, 301 occurs. The second step involves returning a star point potential of the electric motor 2 via the return unit 5 to the evaluation unit 3 or via the control lines 6 to the control unit 4, 302. In a third step, evaluation of the star point potential by the evaluation unit 3 or by the control unit 4, 303 occurs. The last step comprises passivation of the motor fault by the control unit 4 on the basis of the evaluation 304.

Although the invention has been described with reference to exemplary embodiments, various changes and modifications may be made without leaving the scope of protection. The invention may also be used in fields other than aviation, for example in trains, buses or ships, or in any means of transport where also a detection and control device for detecting a motor fault of an electric motor with star point topology is required or desired. Moreover, while at least one exemplary embodiment has been presented on the foregoing summary and detailed description, it should be appreciated that a vast number of variations exist. It should also be appreciated that the exemplary embodiment or exemplary embodiments are only examples, and are not intended to limit the scope, applicability, or configuration. Rather, the foregoing summary and detailed description will provide those skilled in the art with a convenient road map for implementing an exemplary embodiment, wherein it is understood that various changes may be made in the function and arrangement of elements and features of methods described in exemplary embodiments without departing from the scope as set forth in the appended claims and their legal equivalents. Moreover, it should be pointed out that "comprising" does not exclude other elements or steps, and "a" or "an" does not exclude a plurality. In addition, it should be pointed out that any features or steps which have been described with reference to one of the above mentioned exemplary embodiments may also be used in combination with other features or steps of other exemplary embodiments described above. Reference signs in the claims are not to be interpreted as limitations.

What is claimed is:

1. A detection and control device for detecting a motor fault of an electric motor with star point topology, the detection and control device comprising:
    an evaluation unit configured to evaluate a star point potential;
    a control unit configured to passivate the motor fault on at least a basis of an evaluation by the evaluation unit; and
    a return unit configured to return the star point potential of the electric motor to the evaluation unit,
    wherein the evaluation takes place on at least a second basis of a comparison of the star point potential with a reference potential, and
    wherein a fault voltage between the star point potential and the reference potential is generated by the control unit by directed impression of a reactive current component via a plurality of control lines into stator windings of the electric motor.

2. The detection and control device according to claim 1, wherein the evaluation takes place on at least a second basis of a comparison of the star point potential with a calculated reference potential.

3. The detection and control device according to claim 1, wherein the evaluation takes place on at least a second basis of a comparison of the star point potential with an analog reference potential.

4. The detection and control device according to claim 1, wherein a short-circuiting conducts the passivating for a star point system in which the motor fault has been detected.

5. The detection and control device according to claim 1, wherein the passivating limits a short-circuit current and a resulting disturbance torque at the electric motor.

6. The detection and control device according to claim 1, wherein the return unit is a connecting line between a star point of the electric motor and the evaluation unit.

7. The detection and control device according to claim 1, wherein returning the star point potential of the electric motor to the control unit takes place via a plurality of control lines such that a plurality of control lines assume a function of the return unit, and the control unit also assumes a second function of the evaluation unit.

8. The detection and control device according to claim 1, wherein the evaluation unit is integrated with the control unit.

9. A method for detecting a motor fault of an electric motor with star point topology, comprising:
    providing an evaluation unit;
    providing a control unit;
    providing a return unit;
    providing a plurality of control lines;
    returning a star point potential of the electric motor by the return unit to the evaluation unit;
    evaluating the star point potential by the evaluation unit; and
    passivating the motor fault by the control unit on at least a basis of the evaluating the star point potential by the evaluation unit, wherein the evaluating takes place on at least a second basis of a comparison of the star point potential with a reference potential, and
    generating a fault voltage between the star point potential and the reference potential by the control unit by directed impression of a reactive current component via a plurality of control lines into stator windings of the electric motor.

10. The method for detecting the motor fault of the electric motor with star point topology according to claim 9, wherein the passivating the motor fault takes place by short-circuiting a star point system in which the motor fault has been detected.

\* \* \* \* \*